United States Patent
Yokoyama

(10) Patent No.: US 10,170,725 B2
(45) Date of Patent: Jan. 1, 2019

(54) LAMINATED STRUCTURE, DISPLAY DEVICE AND DISPLAY UNIT EMPLOYING SAME

(71) Applicant: Sony Corporation, Tokyo (JP)

(72) Inventor: Seiichi Yokoyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/659,737

(22) Filed: Jul. 26, 2017

(65) Prior Publication Data

US 2017/0338439 A1    Nov. 23, 2017

Related U.S. Application Data

(60) Continuation of application No. 15/222,294, filed on Jul. 28, 2016, now Pat. No. 9,761,825, which is a (Continued)

(30) Foreign Application Priority Data

May 28, 2003   (JP) ................. P2003-151156

(51) Int. Cl.
*H01L 51/52*   (2006.01)
*H01L 51/56*   (2006.01)
(Continued)

(52) U.S. Cl.
CPC ...... *H01L 51/5218* (2013.01); *G02F 1/13439* (2013.01); *G02F 1/133555* (2013.01); *G02F 1/136209* (2013.01); *H01L 27/3211* (2013.01); *H01L 27/3258* (2013.01); *H01L 27/3276* (2013.01); *H01L 51/5203* (2013.01);
(Continued)

(58) Field of Classification Search
CPC ............ H01L 51/5218; H01L 27/3276; H01L 51/5203; H01L 51/5271; H01L 27/3211; H01L 51/56; H01L 27/3258; H01L 51/5234; H01L 51/5209; H01L 2227/323;
(Continued)

(56) References Cited

U.S. PATENT DOCUMENTS 5,667,853 A * 9/1997 Fukuyoshi ............ C23C 14/086
349/139
6,081,310 A    6/2000 Katsuya et al.
(Continued)

FOREIGN PATENT DOCUMENTS

JP   57-060691    4/1982
JP   7-114841     5/1995
(Continued)

OTHER PUBLICATIONS

Japanese Office Action dated Feb. 22, 2007 (11 pages).

*Primary Examiner* — Donald Raleigh
(74) *Attorney, Agent, or Firm* — K&L Gates LLP

(57) ABSTRACT

An organic light-emitting device includes, in order an anode, an organic layer comprising a light-emitting layer, and a cathode. The anode is a laminated structure comprising in order: a first anode layer comprising a metal compound or a conductive oxide; a second anode layer that is a reflective layer; and a third anode layer comprising a metal compound or a conductive oxide. Light generated in the light-emitting layer is extracted through the cathode.

12 Claims, 18 Drawing Sheets

Related U.S. Application Data continuation of application No. 14/695,483, filed on Apr. 24, 2015, now Pat. No. 9,431,627, which is a continuation of application No. 13/895,040, filed on May 15, 2013, now Pat. No. 9,048,451, which is a continuation of application No. 13/416,817, filed on Mar. 9, 2012, which is a division of application No. 11/549,811, filed on Oct. 16, 2006, which is a continuation of application No. 10/854,553, filed on May 26, 2004, now Pat. No. 7,245,341.

(51) Int. Cl.
*G02F 1/1335* (2006.01)
*G02F 1/1343* (2006.01)
*G02F 1/1362* (2006.01)
*H01L 27/32* (2006.01)

(52) U.S. Cl.
CPC ...... *H01L 51/5209* (2013.01); *H01L 51/5234* (2013.01); *H01L 51/5271* (2013.01); *H01L 51/56* (2013.01); *G02F 2001/136295* (2013.01); *G02F 2203/02* (2013.01); *H01L 2227/323* (2013.01); *Y10T 428/24612* (2015.01)

(58) Field of Classification Search
CPC ......... G02F 1/136209; G02F 1/133555; G02F 1/13439
See application file for complete search history.

(56) References Cited

U.S. PATENT DOCUMENTS

| | | |
|---|---|---|
| 6,800,564 B2 | 10/2004 | Park et al. |
| 6,905,907 B2 | 6/2005 | Konuma |
| 6,958,490 B2 | 10/2005 | Okamoto et al. |
| 6,982,432 B2 | 6/2006 | Umemoto et al. |
| 7,105,365 B2 | 9/2006 | Hiroki et al. |
| 7,245,341 B2 | 7/2007 | Yokoyama |
| 2001/0020994 A1 | 9/2001 | Kaneko et al. |
| 2001/0022496 A1* | 9/2001 | Kobayashi ............. H01L 27/32 313/504 |
| 2001/0022632 A1 | 9/2001 | Umemoto et al. |
| 2002/0033907 A1 | 3/2002 | Oke et al. |
| 2002/0047947 A1 | 4/2002 | Hur et al. |
| 2002/0067547 A1 | 6/2002 | Epstein et al. |
| 2002/0125814 A1 | 9/2002 | Uchida |
| 2002/0196628 A1* | 12/2002 | Yoshida ................. F21S 41/37 362/609 |
| 2002/0197875 A1 | 12/2002 | Lin et al. |
| 2003/0020088 A1* | 1/2003 | Seo ..................... H01L 51/5012 257/103 |
| 2003/0047730 A1 | 3/2003 | Konuma |
| 2003/0054653 A1 | 3/2003 | Yamazaki et al. |
| 2003/0060056 A1 | 3/2003 | Park et al. |
| 2003/0080099 A1 | 5/2003 | Tanaka et al. |
| 2003/0104185 A1 | 6/2003 | Dittrich et al. |
| 2003/0228019 A1 | 12/2003 | Eichler et al. |
| 2003/0234608 A1* | 12/2003 | Lee ..................... H01L 51/5218 313/504 |
| 2004/0070808 A1* | 4/2004 | Nakanishi ............. H01L 27/326 359/245 |
| 2004/0135151 A1 | 7/2004 | Okamoto et al. |
| 2004/0160172 A1 | 8/2004 | Tyan et al. |
| 2004/0169812 A1 | 9/2004 | Kim |
| 2005/0181610 A1 | 8/2005 | Sasagawa et al. |
| 2005/0247938 A1 | 11/2005 | Okamoto et al. |

FOREIGN PATENT DOCUMENTS

| | | |
|---|---|---|
| JP | 7-235381 | 9/1995 |
| JP | 7-325313 | 12/1995 |
| JP | 10-240150 | 9/1998 |
| JP | 2002-15623 | 1/2002 |
| JP | 2002-83677 | 3/2002 |
| JP | 2002-216976 | 8/2002 |
| JP | 2002-234792 | 8/2002 |
| JP | 2003-017253 | 1/2003 |
| JP | 2003-55721 | 2/2003 |
| JP | 2003-84683 | 3/2003 |
| JP | 2004-214010 | 7/2004 |
| JP | 2004-319143 | 11/2004 |
| JP | 2004-333882 | 11/2004 |
| WO | 99/03122 | 1/1999 |

* cited by examiner

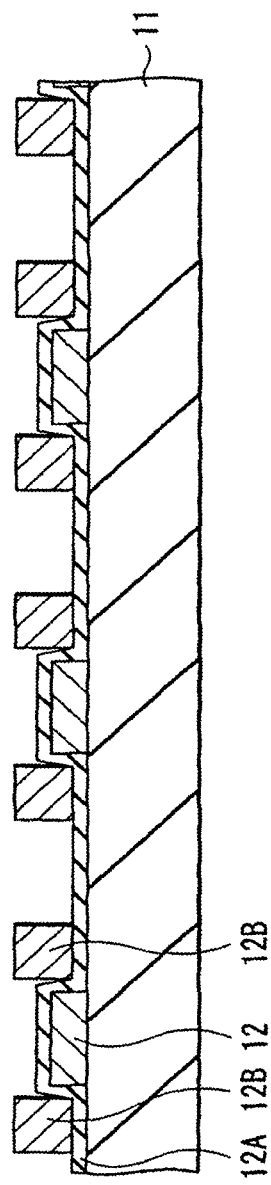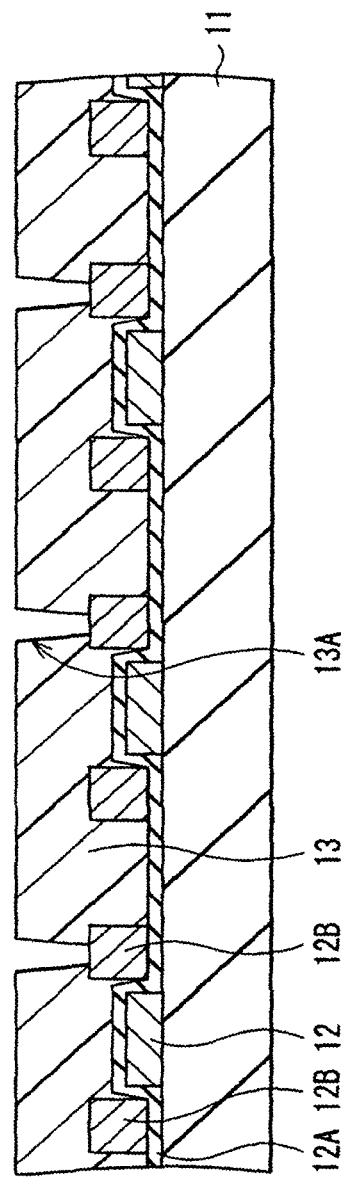

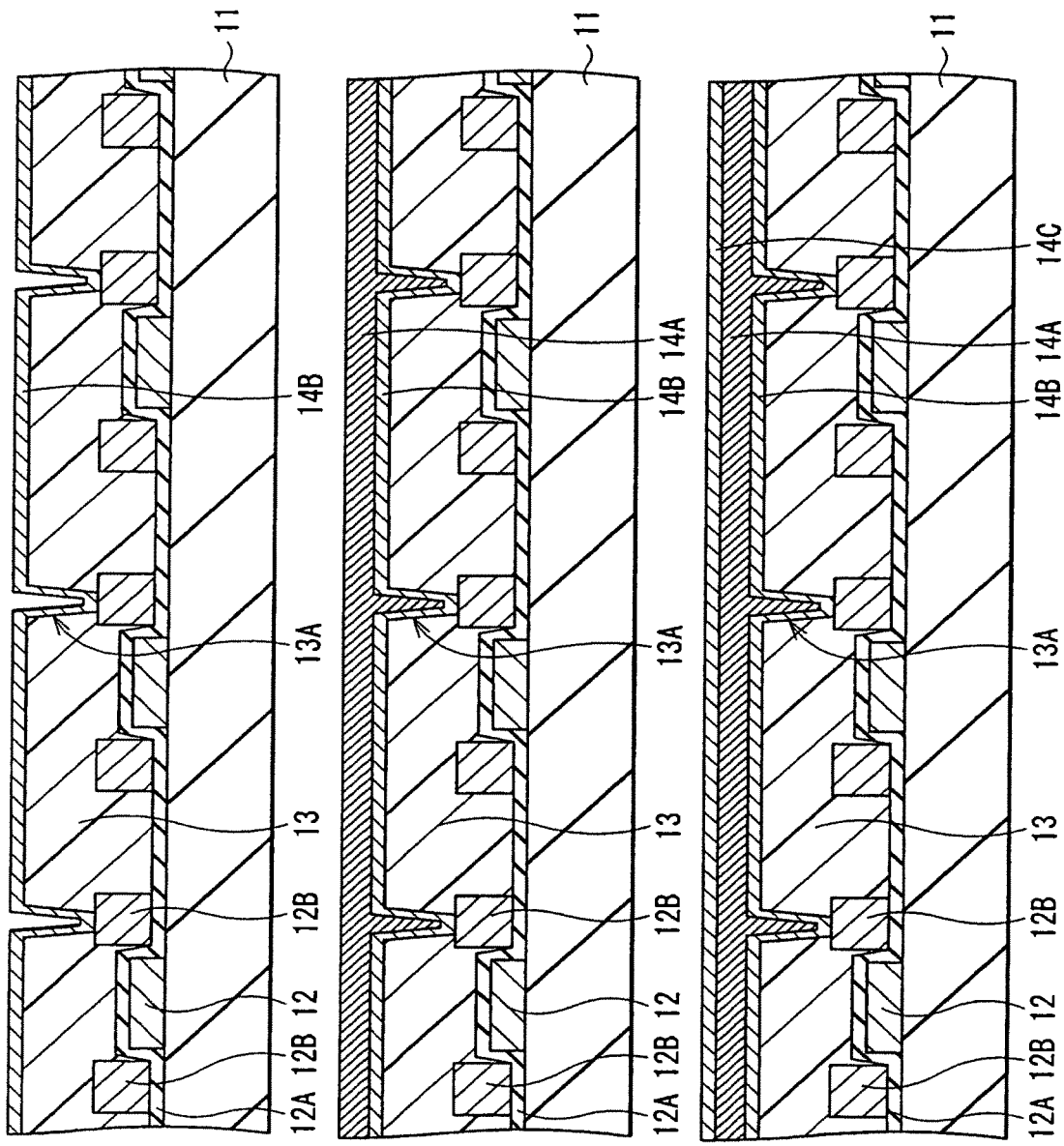

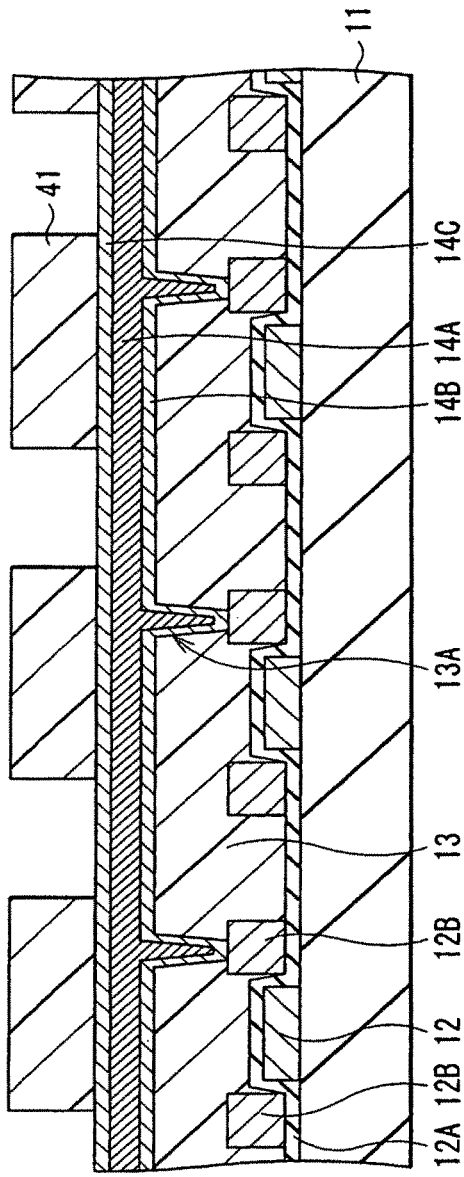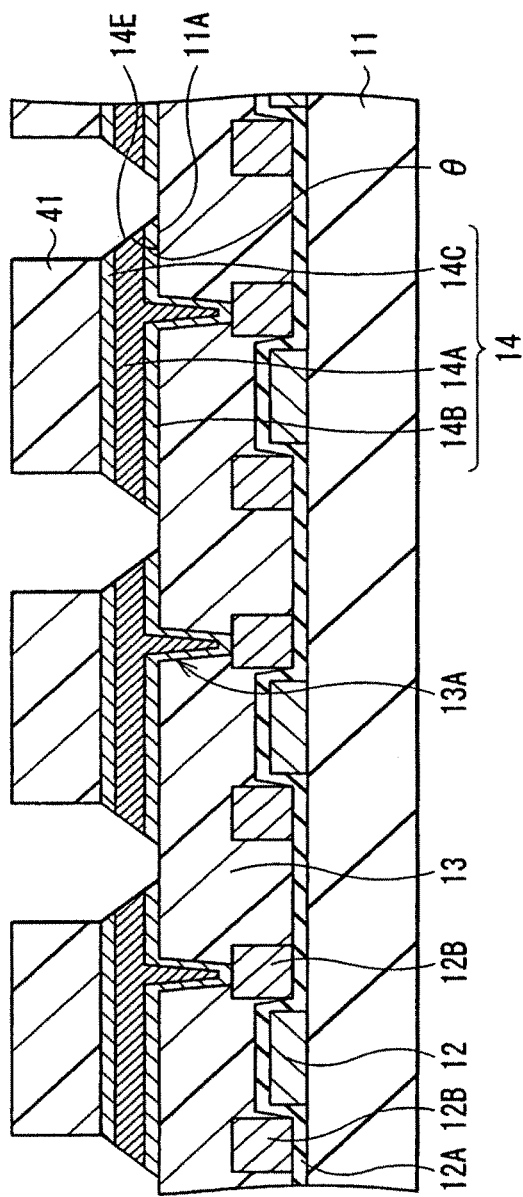

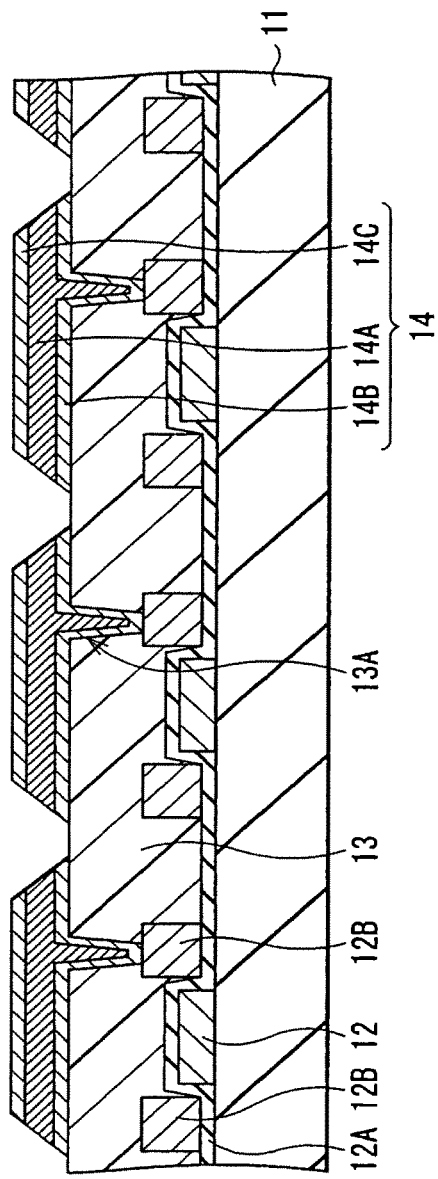
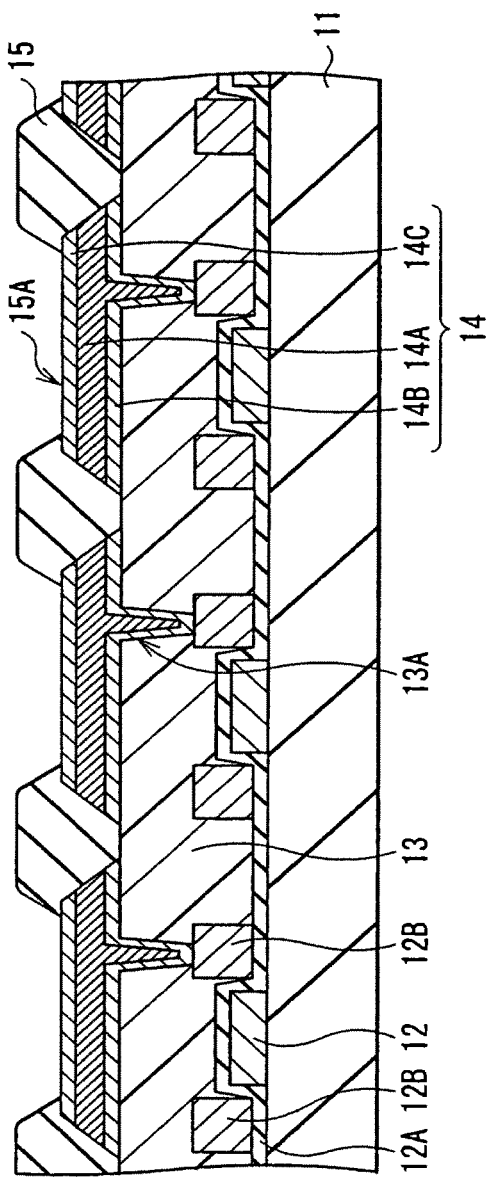

LAMINATED STRUCTURE, DISPLAY DEVICE AND DISPLAY UNIT EMPLOYING SAME

CROSS REFERENCES TO RELATED APPLICATIONS

This application is a continuation of U.S. patent application Ser. No. 15/222,294, filed on Jul. 28, 2016, which application is a continuation of U.S. patent application Ser. No. 14/695,483, filed on Apr. 24, 2015, which issued as U.S. Pat. No. 9,431,627 on Aug. 30, 2016, which is a continuation of U.S. patent application Ser. No. 13/895,040, filed on May 15, 2013, which issued as U.S. Pat. No. 9,048,451 on Jun. 2, 2015, which is a continuation of U.S. patent application Ser. No. 13/416,817, filed on Mar. 9, 2012, which is a divisional of U.S. patent application Ser. No. 11/549,811, filed on Oct. 16, 2006, which is a continuation of U.S. patent Ser. No. 10/854,553, filed on May 26, 2004, which issued as U.S. Pat. No. 7,245,341 on Jul. 17, 2007, and which claims priority to Japanese Patent Application No. P2003-151156, filed on May 28, 2003, the disclosures of which are incorporated by reference herein.

BACKGROUND

The present invention generally relates to a laminated structure. More specifically, the present invention relates to a laminated structure suitable as a reflective electrode, a reflective film, a wiring or the like, its manufacturing method, a display device, and a display unit that employ same.

In recent years, as one of the flat panel displays, an organic light-emitting display which uses organic light-emitting devices has been noted. The organic light-emitting display has characteristics that its viewing angle is wide and its power consumption is low since it is a self-luminous type display. The organic light-emitting display is also thought of as a display having sufficient response to high-definition and high-speed video signals, and is under development toward the practical use.

As an organic light-emitting device, for example, a laminate wherein a first electrode, an organic layer including a light-emitting layer, and a second electrode are sequentially layered on a substrate with a TFT (Thin Film Transistor), a planarizing layer and the like in between is known. Light generated in the light-emitting layer may be extracted from the substrate side in some cases, and may be extracted from the second electrode side in other cases.

As an electrode on the side where light is extracted, a transparent electrode made of a conductive material having transparency such as a compound containing indium (In), tin (Sn), and oxygen (O) (ITO: Indium Tin Oxide) is often used. Conventionally, various structures of the transparent electrode have been proposed. For example, in order to avoid cost rise due to a thick film of ITO, a transparent electrode wherein a metal thin film made of silver (Ag) or the like and a high refractive index thin film made of zinc oxide (ZnO) are layered has been proposed (for example, refer to Japanese Unexamined Patent Application Publication No. 2002-234792). In the transparent electrode, a thickness of the high refractive index thin film is set to from 5 nm to 350 nm, and a thickness of the metal thin film is set to from 1 nm to 50 nm. In this regard, the thickness of the high refractive index thin film is relatively thicker than the thickness of the metal thin film to raise the transparency. In addition, reflection on the surface of the metal thin film is reduced by the high refractive index thin film.

Various metal electrodes are often used for the electrode on the side where light is not extracted. For example, when light is extracted from the second electrode side, the first electrode as an anode is made of, for example, a metal such as chromium (Cr). Conventionally, for example, there is a suggestion that the first electrode is constructed as a two-layer structure including a metal material layer made of chromium and a buffer thin film layer made of an oxide including chromium, and surface roughness of chromium making the metal material layer is reduced by the buffer thin film layer (for example, refer to Japanese Unexamined Patent Application Publication No. 2002-216976).

When light is extracted from the second electrode side, light generated in the light-emitting layer is directly extracted through the second electrode in some cases, but light generated in the light-emitting layer is once reflected by the first electrode and is emitted through the second electrode in other cases. Conventionally, the first electrode has been made of chromium or the like. Therefore, there has been a problem that light absorbance in the first electrode is large and loss of light extracted after reflected by the first electrode is large. The light absorbance in the first electrode has a significant impact on the organic light-emitting devices. When light-emitting efficiency is low, a current necessary to obtain the same intensity is increased. An increase of the driving current significantly affects device life, which is very important for practical use of the organic light-emitting devices.

Therefore, it can be thought that the first electrode is made of silver (Ag) which has the highest reflectance among metals or an alloy containing silver. In this case, since silver is very reactive, in order to prevent its deterioration or corrosion, providing a buffer thin film layer or the like on a surface of the silver layer as in the foregoing conventional art is considered to be useful.

However, when the first electrode has a laminated structure wherein the buffer thin film layer is provided on the surface of the silver layer, there is a risk that a favorable patterning of the first electrode becomes difficult if using the wet etching technique which is conventionally used for patterning silver. The reason thereof is that there is a difference between etching rates of the silver layer and the buffer thin film layer, so that only etching in the silver layer may rapidly proceed. When a shape of the first electrode is not good, an insulating film covering side surfaces of the first electrode is subject to deposition failure or holes, leading to causing defect of the organic light-emitting devices. Dry etching technique for silver has not been developed yet.

SUMMARY

The present invention generally relates to a laminated structure. More specifically, the present invention relates to a laminated structure suitable as a reflective electrode, a reflective film, a wiring or the like, its manufacturing method, a display device, and a display unit that employ same.

The present invention provides a laminated structure which can reduce defect by preventing deposition failure and holes of an insulating film, and manufacturing method, a display device, and a display unit that employ same.

The laminated structure according to an embodiment of the present invention is provided on a surface of a substrate having a flat surface. The laminated structure is made by laminating a plurality of layers and its cross sectional shape in the laminated direction is a forward tapered shape. A taper angle made by a sidewall face of the plurality of layers and the flat surface of the substrate is preferably within the range of 10° to 70°. Here, the sidewall face is a sidewall face of the plurality of layers, and when a cross section of the plurality of layers is a linear flat surface, the sidewall face means the planar face. However, when its cross section is not linear such that the sidewall is curved toward inside, that is, not flat surface, the sidewall face means a virtual face made by a line (face) between a lower end and an upper end of the laminated structure. In an embodiment, an organic layer including a light-emitting layer and a second electrode are sequentially layered on such a laminated structure, and light generated in the light-emitting layer is extracted from the second electrode side. Further, in an embodiment, a driving device which is electrically connected to a pixel electrode of a liquid crystal display device and a wiring are provided on such a laminated structure. Furthermore, such a laminated structure can be a reflective electrode of the liquid crystal display device in an embodiment.

A method for manufacturing the laminated structure according to an embodiment of the present invention includes sequentially laminating a plurality of layers on a flat surface of a substrate; forming a mask on the plurality of layers; and forming a sidewall face of the plurality of layers in a forward tapered shape by etching the plurality of layers all at once by using the mask.

A display device according to an embodiment of the present invention includes a laminated structure including a plurality of layers on a flat surface of a substrate. A cross sectional shape of the laminated structure in the laminated direction is a forward tapered shape.

A display unit according to an embodiment of the present invention includes a plurality of display devices on a flat surface of a substrate. The display device comprises a laminated structure including plurality of layers, and a cross sectional shape of the laminated structure in the laminated direction is a forward tapered shape.

In the laminated structure, the display device, and the display unit according to an embodiment of the present invention, the cross sectional shape in the laminated direction is a forward tapered shape. Therefore, when other film covers the laminated structure, coverage on the sidewall face is improved, and deposition failure, holes and the like are prevented.

In the method for manufacturing the laminated structure according to an embodiment of the present invention, the plurality of layers are sequentially layered on the flat surface of the substrate, and then the mask is formed on the plurality of layers. Next, the sidewall face of the plurality of layers is formed in a forward tapered shape by etching the plurality of layers all at once by using the mask.

Additional features and advantages are described herein, and will be apparent from, the following Detailed Description and the figures.

BRIEF DESCRIPTION OF THE FIGURES

FIGS. 7A and 7B are cross sectional views showing a method for manufacturing the display unit according to an embodiment of the present invention.

FIGS. 8A, 8B, and 8C are cross sectional views showing processes according to an embodiment of the present invention.

FIGS. 9A and 9B are cross sectional views showing processes according to an embodiment of the present invention.

FIGS. 11A and 11B are cross sectional views showing processes according to an embodiment of the present invention.

DETAILED DESCRIPTION

The present invention generally relates to a laminated structure. More specifically, the present invention relates to a laminated structure suitable as a reflective electrode, a reflective film, a wiring or the like, its manufacturing method, a display device, and a display unit that employ same.

Embodiments of the present invention will be described in detail hereinbelow with reference to the drawings.

Figure 1:
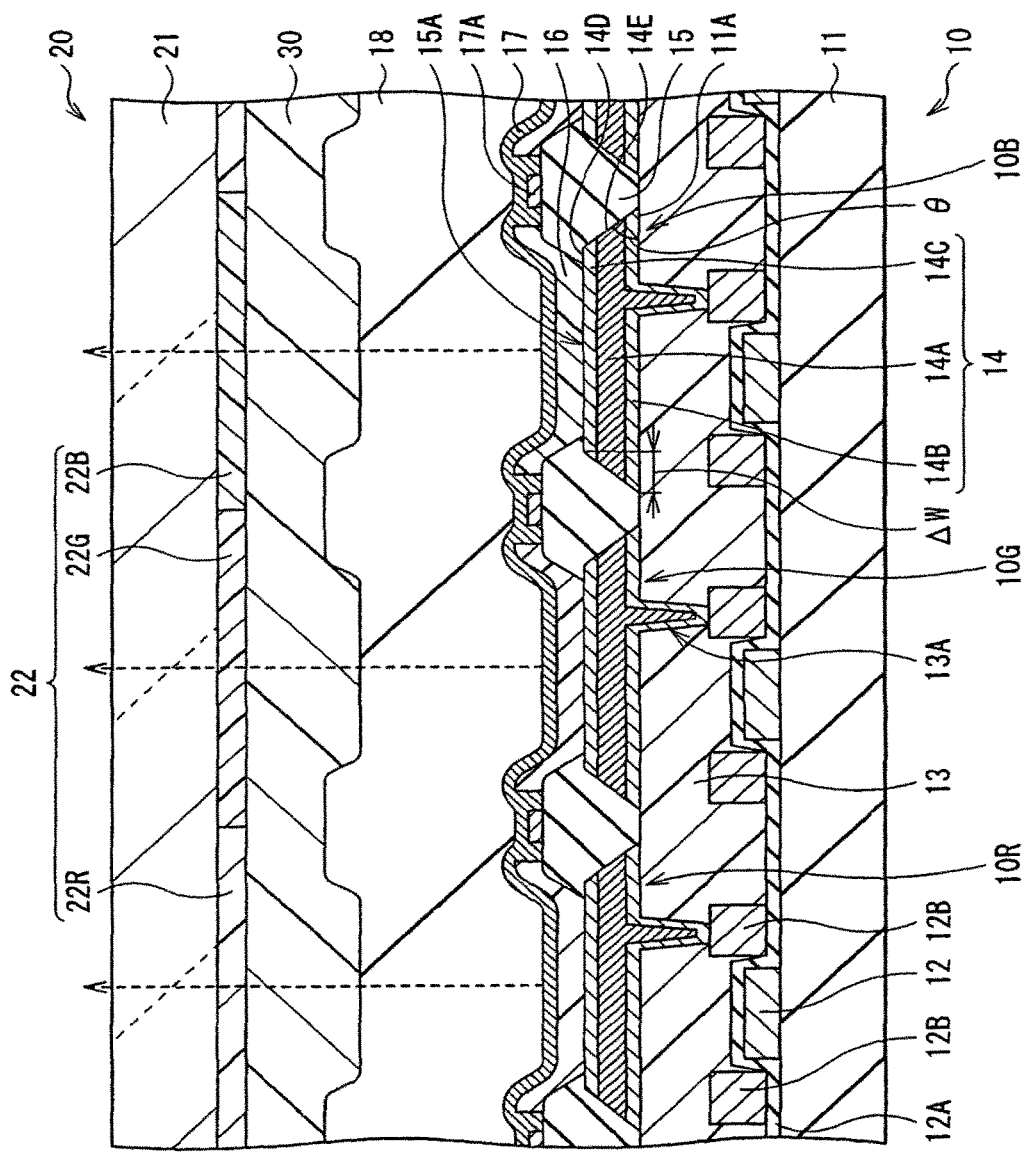
FIG. 1 is a cross sectional view showing a construction of a display unit according to a first embodiment of the present invention.

FIG. 1 shows a cross sectional structure of a display unit according to a first embodiment of the present invention. The display unit is used as an ultra-thin organic light-emitting display. A driving panel 10 and a sealing panel 20 are arranged to face to each other, and their whole surfaces are bonded together with an adhesive layer 30 made of a thermosetting resin. In the driving panel 10, an organic light-emitting device 10R emitting red light, an organic light-emitting device 10G emitting green light, and an organic light-emitting device 10B emitting blue light are provided in the shape of a matrix as a whole sequentially on a substrate 11 made of an insulating material such as glass with a TFT 12 and a planarizing layer 13 in between.

A gate electrode (not shown) of the TFT 12 is connected to an unshown scanning circuit. A source and a drain (not shown either) are connected to a wiring 12B provided through an interlayer insulating film 12A made of, for example, silicon oxide, PSG (Phospho-Silicate Glass) or the like. The wiring 12B is connected to the source and the drain of the TFT 12 through an unshown connecting hole provided on the interlayer insulating film 12A to function as a signal line. The wiring 12B is made of, for example, aluminum (Al) or an aluminum (Al)-copper (Cu) alloy. The structure of the TFT 12 is not limited particularly, and can be either a bottom gate type or a top gate type, for example.

The purpose of a planarizing layer 13 is to planarize the surface of the substrate 11 wherein the TFT 12 is formed to form a flat surface 11A, and evenly form a film thickness of respective layers of the organic light-emitting devices 10R, 10G, and 10B. In the planarizing layer 13, a connecting hole 13A which connects a laminated structure 14 of the organic light-emitting devices 10R, 10G, and 10B to the wiring 12B is provided. Since the fine connecting hole 13A is formed in the planarizing layer 13, the planarizing layer 13 is preferably made of a material having an excellent pattern accuracy. As a material for the planarizing layer 13, an organic material such as polyimide, or an inorganic material such as silicon oxide ($SiO_2$) can be used. In this embodiment, the planarizing layer 13 is made of an organic material such as polyimide.

In the organic light-emitting devices 10R, 10G, and 10B, for example, from the substrate 11 side, the laminated structure (first electrode) 14 as an anode, an insulating film 15, an organic layer 16 including a light-emitting layer, and a common electrode (second electrode) 17 as a cathode are layered in this order with the TFT 12 and the planarizing layer 13 in between. On the common electrode 17, a protective film 18 is formed as necessary.

The laminated structure 14 is formed on a flat surface 11A of the substrate 11 corresponding to the respective organic light-emitting devices 10R, 10G, and 10B. In the laminated structure 14, a plurality of layers are laminated. A cross sectional shape of the laminated structure 14 in the laminated direction is a forward tapered shape.

The laminated structure 14 has also a function as a reflective layer. It is desirable that the laminated structure 14 has as high reflectance as possible in order to improve light-emitting efficiency. Therefore, the laminated structure 14 preferably includes a reflective layer 14A made of silver (Ag) or an alloy containing silver, because silver has the highest reflectance among metals, and can reduce light absorbance loss in the reflective layer 14A. The reflective layer 14A that includes silver is preferable since the highest reflectance can be obtained. However, it is also preferable that the reflective layer 14A is made of an alloy of silver and other metal, since chemical stability and process accuracy can be improved, and adhesion between the reflective layer 14A and an adhesive layer 14B and between the reflective layer 14A and a barrier layer 14C mentioned below can be improved. Silver is very reactive and has low processing accuracy and adhesion, so handling is extremely difficult.

A film thickness of the reflective layer 14A in the laminated direction (hereinafter simply referred to as film thickness) is preferably from about 50 nm to about 200 nm, for example. When its film thickness is within this range, high reflectance can be obtained. Further, its film thickness is more preferably from about 50 nm to about 150 nm. The reason thereof is that by reducing the film thickness of the reflective layer 14A, its surface roughness can be reduced. Therefore, a film thickness of the after-mentioned barrier layer 14C can be reduced to improve light extraction efficiency. Further, by reducing the film thickness of the reflective layer 14A, it becomes possible to reduce surface roughness of the reflective layer 14A due to crystallization of the reflective layer 14A by a heat process in the course of manufacturing, and to prevent an increase in defect of the barrier layer 14C due to surface roughness of the reflective layer 14A.

It is preferable that in the laminated structure 14, the adhesive layer 14B, the reflective layer 14A, and the barrier layer 14C are layered in this order from the substrate 11 side, for example. The adhesive layer 14B is provided between the flat surface 11A of the substrate 11 and the reflective layer 14A to prevent separation of the reflective layer 14A from the planarizing layer 13. The barrier layer 14C prevents silver or an alloy containing silver which makes the reflective layer 14A from reacting with oxygen in the air or sulfur. The barrier layer 14C also has a function as a protective film to reduce damage to the reflective layer 14A in the manufacturing process after forming the reflective layer 14A. The barrier layer 14C also has a function as a surface planarizing film which reduces surface roughness of the reflective layer 14A made of silver or an alloy containing silver.

The barrier layer 14C is preferably made of, for example, a metallic compound or a conductive oxide containing at least one element, such as indium (In), tin (Sn), zinc (Zn) and the like. Specifically, the barrier layer 14C is preferably made of at least one type of material, such as compound containing indium (In), tin (Sn) and oxygen (O) (ITO: Indium Tin Oxide); a compound containing indium (In), zinc (Zn) and oxygen (O) (IZO: Indium Zinc Oxide); indium oxide ($In_2O_3$), tin oxide ($SnO_2$), and zinc oxide (ZnO) and the like. By using these types of materials as a barrier layer 14C, planarization of the laminated structure 14 can be improved. Therefore, film thicknesses of respective layers of the organic layer 16 can be uniform, so that there is no danger of short circuit between the laminated structure 14 and the common electrode 17 due to lack of film thickness of the organic layer 16. In addition, particularly when forming an after-mentioned resonator structure, color unevenness inside pixels can be prevented and color reproducibility can be improved. Further, since these materials have a very small light absorption in the visible light region, light absorption loss in the barrier layer 14C can be reduced and light extraction efficiency can be improved. Furthermore, the barrier layer 14C also has a function as a work function adjustment layer to raise hole injection efficiency into the organic layer 16. Therefore, the barrier layer 14C is preferably made of a material which has a higher work function than the reflective layer 14A. In view of productivity, ITO, IZO and the like are particularly preferable in an embodiment.

In order to secure a function as the protective film mentioned above, a film thickness of the barrier layer 14C is preferably from about 1 nm to about 50 nm, for example. Further, in order to improve light extraction efficiency, a film thickness of the barrier layer 14C is more preferably from about 3 nm to about 15 nm.

The adhesive layer 14B is preferably made of, for example, a metallic compound or a conductive oxide containing at least one element, such as indium (In), tin (Sn), zinc (Zn) and the like. More specifically, the adhesive layer 14B is preferably made of at least one type of material, such as a compound containing indium (In), tin (Sn) and oxygen (O) (ITO: Indium Tin Oxide); a compound containing indium (In), zinc (Zn) and oxygen (O) (IZO: Indium Zinc Oxide); indium oxide ($In_2O_3$), tin oxide ($SnO_2$), and zinc oxide (ZnO). In this regard, when etching the adhesive layer 14B after etching the barrier layer 14C and the reflective layer 14A, it is not necessary to form a new mask or change an etching gas, and it is possible to conduct patterning by using the same mask and the same etching gas.

The adhesive layer 14B preferably has a film thickness capable of inhibiting hillock or separation of the reflective layer 14A. In an embodiment, a film thickness of the adhesive layer 14B is preferably from about 5 nm to about 50 nm, and more preferably from about 10 nm to about 30 nm.

The adhesive layer 14B and the barrier layer 14C can be made of either the same material, or different materials selected from the foregoing materials. In an embodiment, both the adhesive layer 14B and the barrier layer 14C are made of ITO. In an embodiment, the adhesive layer 14B is made of ITO and the barrier layer 14C is made of IZO, respectively. In an embodiment, both the adhesive layer 14B and the barrier layer 14C are made of IZO. In an embodiment, the adhesive layer 14B is made of ZnO and the barrier layer 14C is made of ITO, respectively.

The laminated structure 14 has a forward tapered shape, wherein its width becomes gradually narrow from the flat surface 11A of the lower end face toward an upper end face 14D. Therefore, a sidewall face 14E of the adhesive layer 14B, the reflective layer 14A, and the barrier layer 14C is entirely covered by the insulating film 15, and deposition failure or holes of the insulating film 15 can be prevented. Consequently, deterioration or the like of the reflective layer 14A due to deposition failure or holes of the insulating film 15 can be prevented, thereby avoiding defect of the organic light-emitting devices 10R, 10G, and 10B.

A taper angle θ made by the sidewall face 14E of the adhesive layer 14B, the reflective layer 14A, and the barrier layer 14C and the flat surface 11A of the substrate 11 is preferably within the range of about 10° to about 70°. When the taper angle θ is smaller than about 10°, a pattern of the laminated structure 14 becomes too wide, and such a condition is unfavorable for high definition. Meanwhile, when the taper angle θ is more than about 70°, the sidewall face 14E has a precipitous property almost close to perpendicularity. In this case, it is possible that the insulating film 15 may be subject to deposition failure or holes. The taper angle θ is more preferably from about 25° to about 50°, and much more preferably from about 35° to about 45°. When the taper angle θ is within this range, for example, it is possible that a pattern width ΔW on one side of the laminated structure 14 can be about 0.15 μm to about 0.3 μm where, for example, a total film thickness of the laminated structure 14 is about 130 nm. In this regard the pattern of the laminated structure 14 is not too wide, and deposition failure and holes of the insulating film 15 can be prevented effectively.

Figure 2:
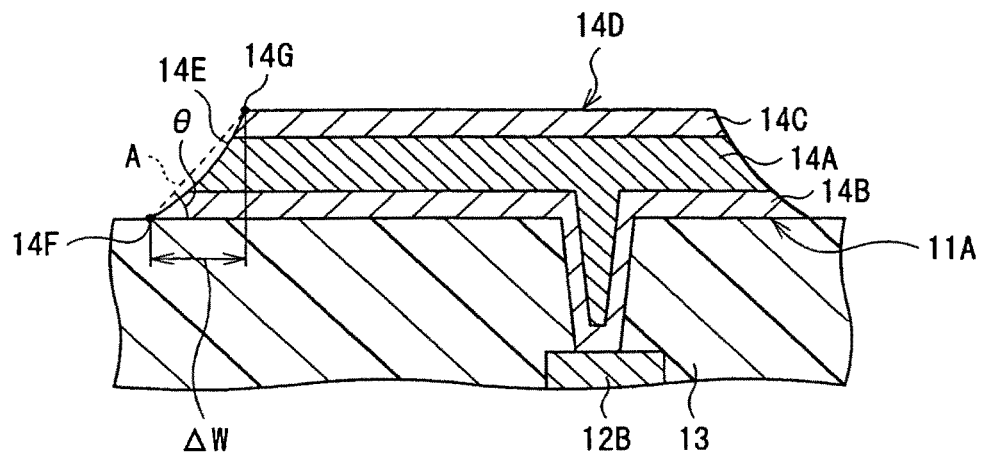
FIG. 2 is a cross sectional view showing an example of a laminated structure according to an embodiment of the present invention.

Here, the sidewall face 14E of the adhesive layer 14B, the reflective layer 14A, and the barrier layer 14C means the planar face, when its cross section is linear flat surface as shown in FIG. 1. However, when the cross section of the sidewall face 14E is not linear, that is, not flat surface, for example, as shown in FIG. 2, the sidewall face 14E is curved toward inside, the sidewall face 14E means a virtual face A made by a line (face) between an end 14F of the flat surface 11A, which is the lower end of the laminated structure 14 and an end 14G of the upper end 14D.

Figure 3:
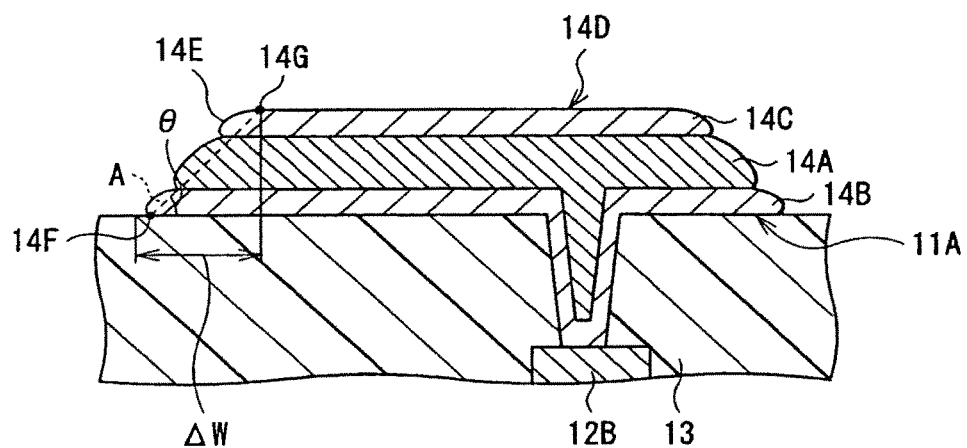
FIG. 3 is a cross sectional view showing another example of a laminated structure according to an embodiment of the present invention.
Figure 4:
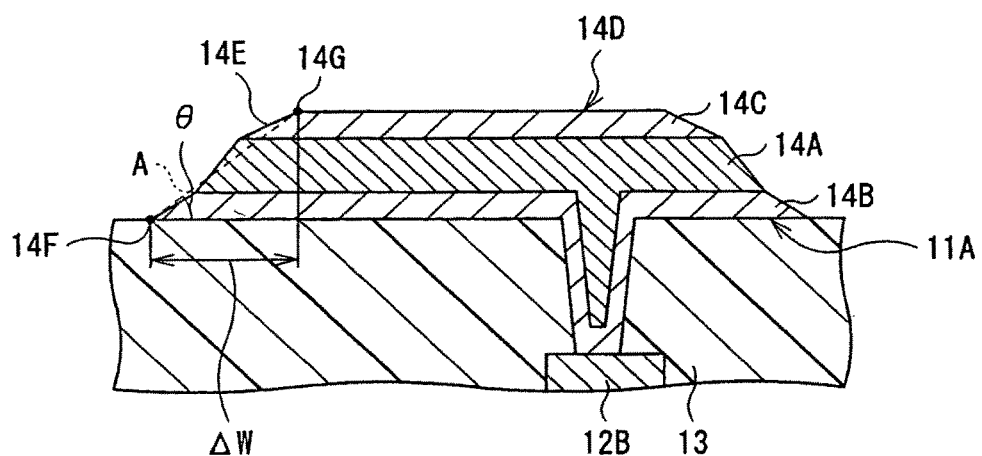
FIG. 4 is a cross sectional view showing still another example of a laminated structure shape according to an embodiment of the present invention.

As shown in FIG. 3, in the sidewall face 14E of the adhesive layer 14B, the reflective layer 14A, and the barrier layer 14C, interfaces between the reflective layer 14A and the barrier layer 14C, and between the reflective layer 14A and the adhesive layer 14B can be in a stepped shape due to erosion in etching. Further, as shown in FIG. 4, the respective slopes of the barrier layer 14C, the reflective layer 14A, and the adhesive layer 14B are different from each other, and a broken line is made. It should be appreciated that the shape of the sidewall face 14E is not limited to the examples shown in FIGS. 1 to 4.

The purpose of the insulating film 15 is to secure insulation between the laminated structure 14 and the common electrode 17, and to make a shape of the light-emitting region in the organic light-emitting devices 10R, 10G, and 10B in a desired shape. For example, the insulating film 15 has a film thickness of about 600 nm, and is made of an insulating material such as silicon oxide and polyimide. The insulating film 15 is formed to cover from the sidewall face 14E to the upper peripheral part of the laminated structure 14. An opening 15A is provided corresponding to the light-emitting region of the laminated structure 14, that is the organic light-emitting devices 10R, 10G, and 10B.

Figure 5:
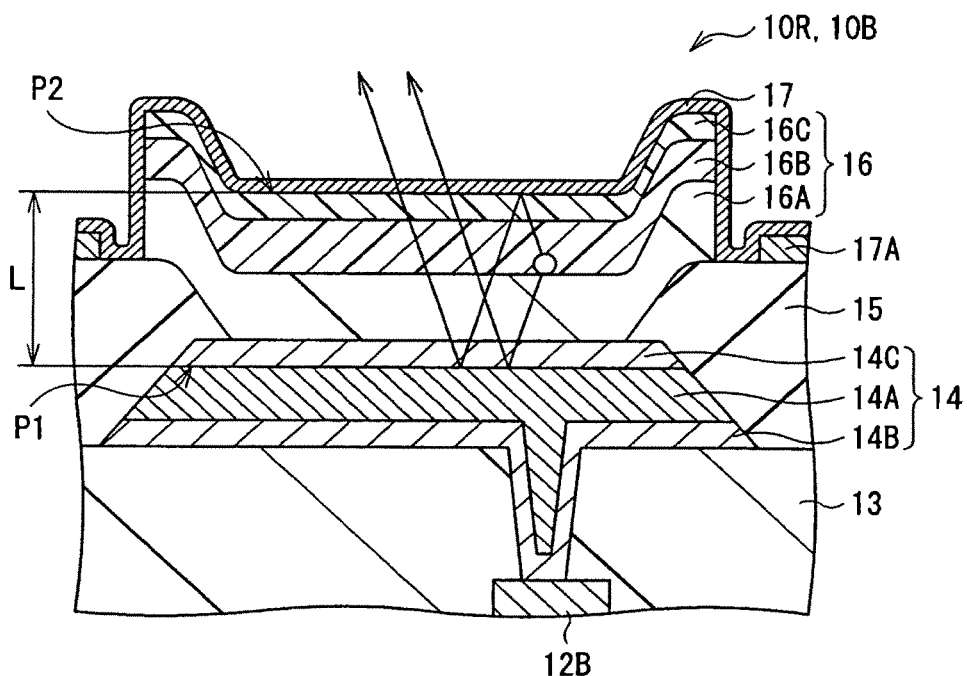
FIG. 5 is a cross sectional view showing an enlarged construction of an organic light-emitting device according to an embodiment of the present invention.

Constructions of the organic layer 16 vary depending on colors emitted from the organic light-emitting devices 10R, 10G, and 10B. FIG. 5 shows an enlarged view of a construction of the organic layer 16 of the organic light-emitting devices 10R and 10B. The organic layer 16 of the organic light-emitting devices 10R and 10B has a construction wherein avoid transport layer 16A, a light-emitting layer 16B, and an electron transport layer 16C are layered in this order from the laminated structure 14 side. The purpose of the hole transport layer 16A is to improve efficiency of hole injection into the light-emitting layer 16B. In this embodiment, the hole transport layer 16A also has a function as an hole injection layer. The purpose of the light-emitting layer 16B is to generate recombination of electrons and holes by applying electric field to generate light and emits light in a region corresponding to the opening 15A of the insulating film 15. The purpose of the electron transport layer 16C is to improve efficiency of electron injection into the light-emitting layer 16B.

The hole transport layer 16A of the organic light-emitting device 10R has a film thickness of about 45 nm for example, and is made of bis [(N-naphthyl)-N-phenyl]benzidine (α-NPD). The light-emitting layer 16 B of the organic light-emitting device 10R has a film thickness of about 50 nm for example, and is made of 2,5-bis[4-[N-(4-methoxy phenyl)-N-phenyl amino]] styrylbenzene-1,4-dicarbonitrile (BSB). The electron transport layer 16C of the organic light-emitting device 10R has a film thickness of about 30 nm for example, and is made of 8-quinolinol aluminum complex ($Alq_3$).

The hole transport layer 16A of the organic light-emitting device 10B has a film thickness of about 30 nm for example, and is made of α-NPD. The light-emitting layer 16B of the organic light-emitting device 10B has a film thickness of about 30 nm for example, and is made of 4,4'-bis (2,2'-diphenyl vinyl) biphenyl (DPVBi). The electron transport layer 16C of the organic light-emitting device 10B has a film thickness of about 30 nm for example, and is made of $Alq_3$.

Figure 6:
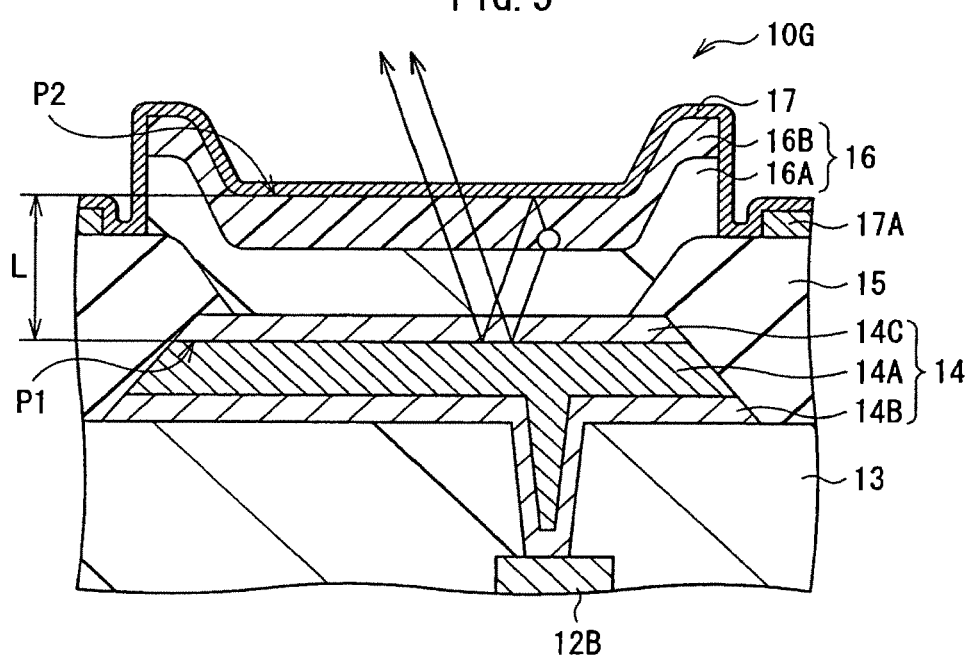
FIG. 6 is a cross sectional view showing an enlarged construction of the organic light-emitting device according to an embodiment of the present invention.

FIG. 6 shows an enlarged view of a construction of the organic layer 16 of the organic light-emitting device 10G.

The organic layer 16 of the organic light-emitting device 10G has a construction wherein an hole transport layer 16A and a light-emitting layer 16B are layered in this order from the laminated structure 14 side. The hole transport layer 16A also has a function as an hole injection layer. The light-emitting layer 16B also has a function as an electron transport layer.

The hole transport layer 16A of the organic light-emitting device 10G has a film thickness of about 50 nm for example, and is made of α-NPD. The light-emitting layer 16B of the organic light-emitting device 10G has a film thickness of about 60 nm for example, and is made of Alq$_3$ mixed with 1 vol % of Coumarin 6 (C6).

The common electrode 17 shown in FIGS. 1, 5, and 6 has a film thickness of about 10 nm for example, and is made of a metal or an alloy of silver (Ag), aluminum (Al), magnesium (Mg), calcium (Ca), sodium (Na) or the like. In this embodiment, for example, the common electrode 17 is made of an alloy of magnesium (Mg) and silver (MgAg alloy).

The common electrode 17 is formed to cover all the organic light-emitting devices 10R, 10G, and 10B. In order to inhibit voltage drop in the common electrode 17, it is preferable that an auxiliary electrode 17A is provided on the insulating film 15. The auxiliary electrode 17A is provided in gaps between the organic light-emitting devices 10R, 10G, and 10B. An end of the auxiliary electrode 17A is connected to a trunk-shaped auxiliary electrode (not shown) which becomes a bus for the auxiliary electrode 17A, which is formed in a peripheral part of the substrate 11 to surround the area where the organic light-emitting devices 10R, 10G, and 10B are provided. The auxiliary electrode 17A and the trunk-shaped auxiliary electrode of the bus are made of a monolayer of a low-resistance conductive material such as aluminum (Al) and chromium (Cr), or a laminated structure thereof.

The common electrode 17 also has a function as a semi-transparent reflective layer. That is, the organic light-emitting devices 10R, 10G, and 10B have a resonator structure, wherein light generated in the light-emitting layer 16B is resonated and extracted from a second end P2 side by using the organic layer 16 and the barrier layer 14C as a resonant part, where an interface between the reflective layer 14A and the barrier layer 14C of the laminated structure 14 is a first end P1, and an interface of the common electrode 17 on a side close to the light-emitting layer 16B is the second end P2. When the organic light-emitting devices 10R, 10G, and 10B have such a resonator structure, light generated in the light-emitting layer 16B generates multiple interference and acts as a kind of a narrow-band filter. In result, a half value width of the spectrum of extracted light is reduced, and color purity can be improved. Therefore, such a resonator structure is preferable. This resonator structure is preferable, since outside light entering from the sealing panel 20 can be attenuated by multiple interference, and a reflectance of outside light can be significantly reduced in the organic light-emitting devices 10R, 10G, and 10B by combining with an after-mentioned color filter 22 (refer to FIG. 1).

In order to obtain the foregoing effects, it is preferable that an optical distance L between the first end P1 and the second end P2 of the resonator satisfies Mathematical Formula 1, and a resonant wavelength of the resonator (peak wavelength of the spectrum of light to be extracted) and a peak wavelength of the spectrum of the light desired to be extracted correspond to each other. Actually, the optical distance L is preferably selected to be a positive minimum value to satisfy Mathematical Formula 1 as follows:

$$(2L)/\lambda + \Phi/(2\pi) = m$$

In the formula, L represents an optical distance between the first end P1 and the second end P2; $\Phi$ represents the sum of a phase shift $\Phi_1$ of the reflected light generated in the first end P1 and a phase shift $\Phi_2$ of the reflected light generated in the first end P2 ($\Phi = \Phi_1 + \Phi_2$) (rad); $\lambda$, represents a peak wavelength of a spectrum of light desired to be extracted from the second end P2 side; and m represents an integer number which gives a positive value of L. In Mathematical Formula 1, units for L and $\lambda$, should be common, that is, nm is used as a unit for them, for example.

The protective film 18 shown in FIG. 1 has a film thickness of about 500 nm to about 10,000 nm for example, and is a passivation film made of a transparent dielectric. The protective film 18 is made of, for example, silicon oxide (SiO$_2$), silicon nitride (SiN) or the like.

As shown in FIG. 1, the sealing panel 20 is positioned on the common electrode 17 side of the driving panel 10. The sealing panel 20 includes a sealing substrate 21 which seals the organic light-emitting devices 10R, 10G, and 10B along with the adhesive layer 30. The sealing substrate 21 is made of a material transparent to light generated in the organic light-emitting devices 10R, 10G, and 10B such as glass. The sealing substrate 21 includes the color filter 22 for example. The color filter 22 extracts light generated in the organic light-emitting devices 10R, 10G, and 10B, absorbs outside light reflected in the organic light-emitting devices 10R, 10G, and 10B, and the wiring therebetween, thereby the contrast is improved.

The color filter 22 can be provided on either side of the sealing substrate 21. However, it is preferable to provide the color filter 22 on the driving panel 10 side, since the color filter 22 is not exposed on the surface, and can be protected by the adhesive layer 30. The color filter 22 comprises a red filter 22R, a green filter 22G, and a blue filter 22B, which are sequentially arranged corresponding to the organic light-emitting devices 10R, 10G, and 10B, respectively.

The red filter 22R, the green filter 22G, and the blue filter 22B are formed in a rectangular shape with no space in between. The red filter 22R, the green filter 22G, and the blue filter 22B are made of a resin mixed with pigments, respectively. By selecting the pigments, adjustment is made so that the light transmittance in a target wavelength of red, green, or blue can be high, and the light transmittance in other wavelengths can be low.

A wavelength range having a high transmittance in the color filter 22 corresponds to a peak wavelength $\lambda$, of a spectrum of light to be extracted from the resonator structure. Therefore, among outside light entering from the sealing panel 20, only the light which has a wavelength equal to a peak wavelength $\lambda$, of a spectrum of light to be extracted passes through the color filter 22, and outside light having other wavelength is prohibited from entering the organic light-emitting devices 10R, 10G, and 10B.

This display unit can be manufactured as follows, for example.

FIGS. 7A to 18 show the steps in a method for manufacturing the display unit in order. First, as shown in FIG. 7A, the TFT 12, the interlayer insulating film 12A, and the wiring 12B are formed on the substrate 11 made of the foregoing materials.

Next, as shown in FIG. 7B, the planarizing layer 13 made of the foregoing material is formed over the whole area of the substrate 11 by spin coat method, for example, the planarizing layer 13 is patterned in a given shape by exposure and development, and the connecting hole 13A is formed. After that, in order to transform polyimide into imide, the resultant is baked in a clean baking furnace at, for example, about 320° C.

Subsequently, as shown in FIG. 8A, the adhesive layer 14B made of, for example, ITO having a film thickness of, for example, about 20 nm is formed on the flat surface 11A formed by the planarizing layer 13 by sputtering for example.

After that, as shown in FIG. 8B, the reflective layer 14A made of, for example, an alloy containing silver having a film thickness of, for example, about 100 nm is formed on the adhesive layer 14B by, for example, sputtering. By forming the reflective layer 14A on the planarizing layer 13 with the adhesive layer 14B in between as above, it becomes possible to prevent the reflective layer 14A from being separated from the planarizing layer 13 as a base layer. Further, it becomes possible to prevent intrusion of an etching solution, air or the like from the separated portion, and to prevent silver or an alloy containing silver making the reflective layer 14A from reacting with oxygen or sulfur contained in the etching solution or the air.

Next, as shown in FIG. 8C, the barrier layer 14C made of, for example, ITO having a film thickness of, for example, about 10 nm is formed on the reflective layer 14A by, for example, sputtering. By forming the barrier layer 14C immediately after forming the reflective layer 14A, it becomes possible to prevent silver or an alloy containing silver making the reflective layer 14A from reacting with oxygen or sulfur in the air. Further, it becomes possible to reduce damage to the reflective layer 14A even in the manufacturing process after forming the reflective layer 14A, and maintain the interface between the reflective layer 14A and the barrier layer 14C clean.

After forming the adhesive layer 14B, the reflective layer 14A, and the barrier layer 14C, as shown in FIG. 9A, a mask 41 made of, for example, a photoresist film is formed on the barrier layer 14C by using, for example, lithography.

Subsequently, as shown in FIG. 9B, by using the mask 41, the barrier layer 14C, the reflective layer 14A, and the adhesive layer 14B are etched all at once. The sidewall face 14E is thereby formed in a forward tapered shape. Here, as mentioned above, a taper angle θ made by the sidewall face 14E and the flat surface 11A of the substrate 11 is preferably within the range of about 10° to about 70°.

This etching performed all at once needs to be provided by dry etching. If using wet etching, the barrier layer 14C, the reflective layer 14A, and the adhesive layer 14B cannot be patterned all at once, and a new mask needs to be formed at least once in the middle of etching when etching the adhesive layer 14B, for example. Therefore, considering room of mask alignment and the like it cannot be avoided that a flat surface is formed at the interface between the reflective layer 14A and the adhesive layer 14B, so that it is difficult to form the sidewall face 14E in a forward tapered shape. Further, when using the wet etching, there is a large difference, twice or more between etching rates of ITO and silver, for example. Therefore, only silver might be rapidly etched and side etching might proceed unless their etching rates are totally the same. Meanwhile, when using the dry etching, even if there is a difference between etching rates of ITO and silver, problems such as side etching never arise though slightly uneven shape is obtained as shown in FIGS. 2 to 4. In result, in the dry etching, the sidewall face 14E can be formed in a forward tapered shape.

In the dry etching, it is preferable to use an etching gas containing a component capable of forming a volatile compound with all the reflective layer 14A, the adhesive layer 14B, and the barrier layer 14C. More specifically, for example, an etching gas containing methane ($CH_4$) is preferably used. Methane reacts with silver to produce methyl silver ($AgCH_3$). This methyl silver is volatile, and is easy to be removed. When the adhesive layer 14B and the barrier layer 14C are made of, for example, a material containing indium (In), methane reacts with indium (In) to produce methyl indium (In $(CH_3)_3$). This methyl indium is also volatile, and is easy to be removed. Meanwhile, for example, when using an etching gas containing a component which forms an involatile compound with silver, such as halogen, for example, fluoride (F), chlorine (Cl), this involatile reaction product is deposited on the sidewall face 14E, and removal of such a deposited product is difficult. Therefore, using such an etching gas is not preferable.

Figure 10:
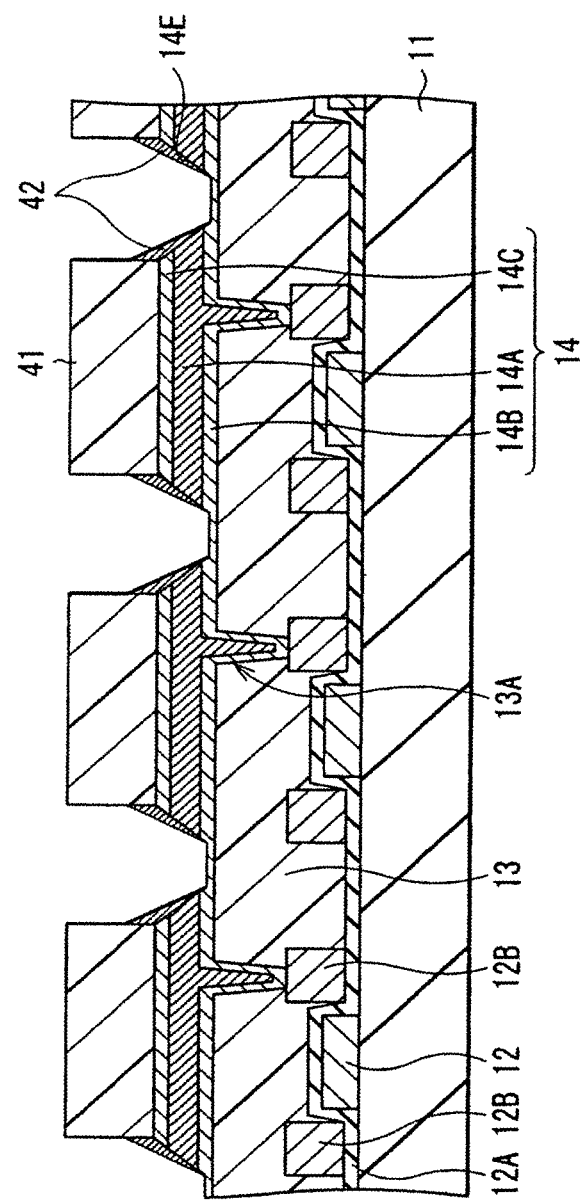
FIG. 10 is a cross sectional view showing a process according to an embodiment of the present invention.

Regarding control of etching conditions to form the sidewall face 14E in a forward tapered shape, various methods can be thought. For example, there is a method as follows. By using an unshown plasma light-emitting monitor, exposure of the surface of the adhesive layer 14B after finishing etching of the barrier layer 14C and the reflective layer 14A is detected. After that, etching conditions are changed. That is, as shown in FIG. 10, etching conditions are changed as follows. Along with etching progress of the adhesive layer 14B, a deposition protective film 42 is formed on the exposed sidewall face 14E of the barrier layer 14C and the reflective layer 14A. This deposition protective film 42 is formed by depositing an organic substance derived from methane or the like on the sidewall face 14E of the barrier layer 14C and the reflective layer 14A. Due to the deposition protective film 42, the adhesive layer 14B can be etched while protecting the sidewall face 14E which is already formed in a forward tapered shape.

There is other method as follows. After detecting exposure of the surface of the adhesive layer 14B, etching conditions are changed as follows. That is, for example, by raising an etching rate of ITO, an etching selection ratio of the adhesive layer 14B and the planarizing layer 13 on the substrate 11 is improved.

Further, it is possible to adopt etching conditions to satisfy the foregoing two methods. That is, it is possible to adopt the conditions wherein the deposition protective film 42 is formed, and an etching selection ratio of the adhesive layer 14B and the planarizing layer 13 on the substrate 11 is improved as well.

As concrete etching conditions after change, the following techniques can be utilized, for example. For example, a technique to promote deposition of the deposition protective film 42 by increasing methane flow rate, a technique to modify a vertical component of the etching gas by changing pressure from the high vacuum side to low vacuum side, and a technique to modify a vertical component of the etching gas by lowering bias power can be utilized.

In this embodiment, for example, when forming the laminated structure 14 having the taper angle θ of about 30°, etching conditions before change is set to as follows: a flow rate of methane is 20 SCCM, a flow rate of argon (Ar) is 20 SCCM, a pressure is 1.5 Pa, a bias power is 1,000 W. Meanwhile, etching conditions after change is set to as follows: a flow rate of methane is 40 SCCM, a flow rate of argon is 20 SCCM, a pressure is 3 Pa, a bias power is 750 W. This is a case on the assumption that the sidewall face 14E is formed in a forward tapered shape while forming the deposition protective film 42.

After that, as shown in FIG. 11A, the mask 41 is removed. Then, as shown in FIG. 11B, the insulating film 15 having the foregoing film thickness is deposited over the whole area of the substrate 11 by, for example, CVD (Chemical Vapor Deposition). After that, the opening 15A is formed by selectively removing a part of the insulating film 15 corresponding to the light-emitting region by using, for example, lithography.

Figure 12:
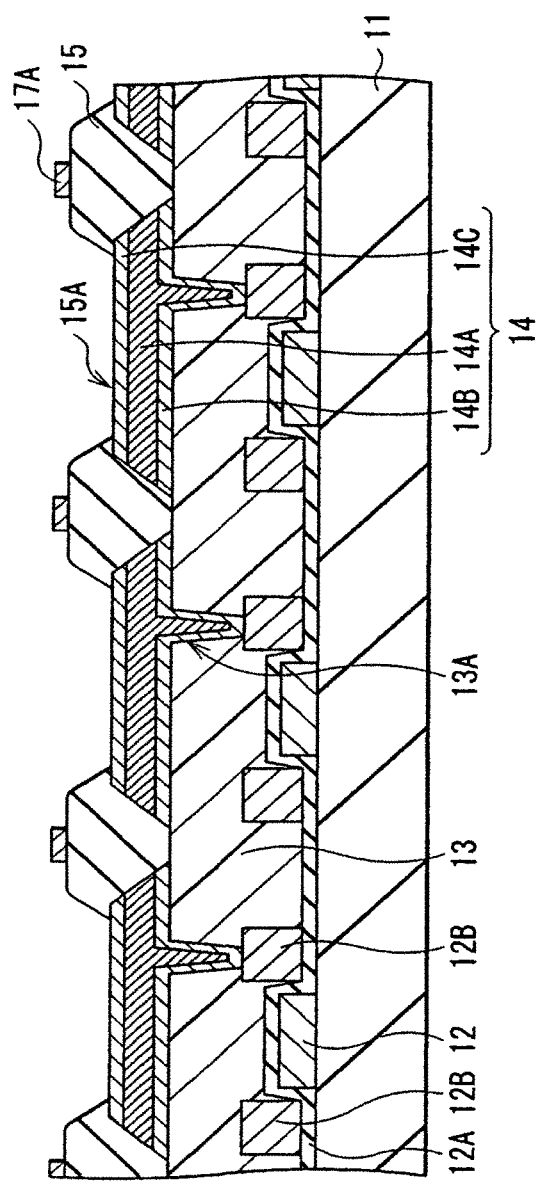
FIG. 12 is a cross sectional view showing a process according to an embodiment of the present invention.

Next, as shown in FIG. 12, the auxiliary electrode 17A is formed on the insulating film 15 over the whole area of the substrate 11. Then, the auxiliary electrode 17A is selectively etched and patterned in a given shape by using, for example, lithography.

Figure 13:
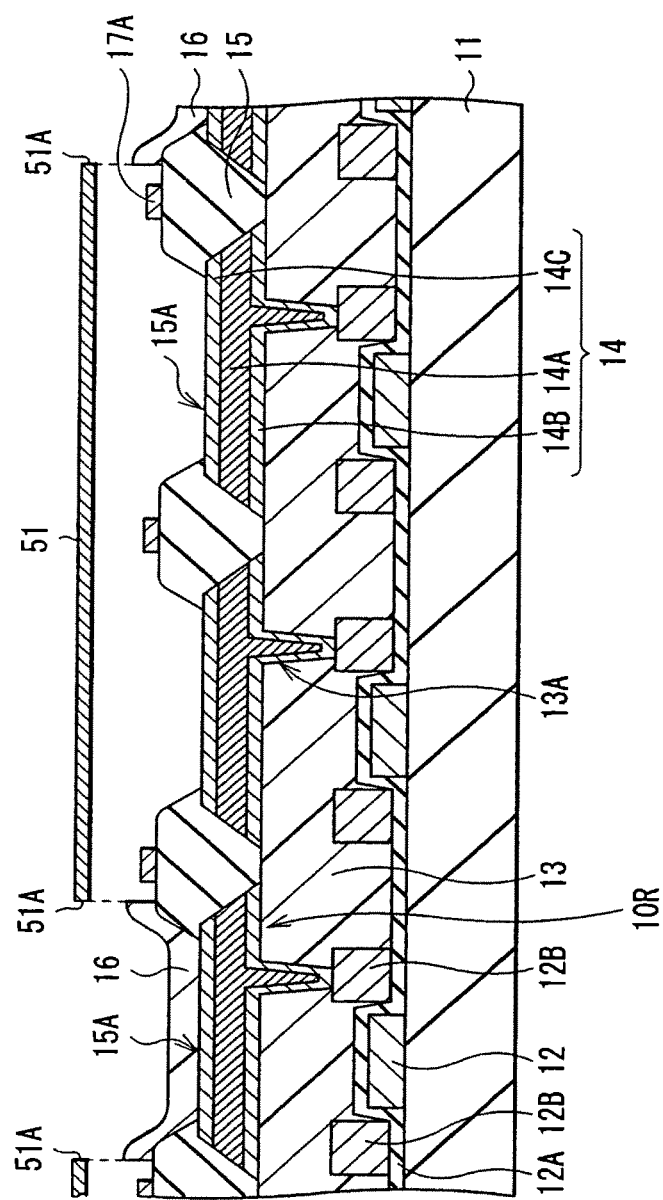
FIG. 13 is a cross sectional view showing a process according to an embodiment of the present invention.

Subsequently, as shown in FIG. 13, the electron transport layer 16A, the light-emitting layer 16B, and the electron transport layer 16C of the organic light-emitting device 10R, which respectively have the foregoing film thickness and are made of the foregoing materials, are sequentially deposited to form the organic layer 16 of the organic light-emitting device 10R by, for example, deposition. In this regard, it is preferable that deposition is performed corresponding to the light-emitting region, that is, the opening 15A of the insulating film 15 by using a metal deposition mask 51 having an opening 51A corresponding to the region where the organic layer 16 is formed. However, it is difficult to precisely deposit the organic layer 16 only in the opening 15A. Therefore, deposition may be performed to cover the whole opening 15A, and the organic layer 16 may slightly cover edges of the insulating film 15.

Figure 14:
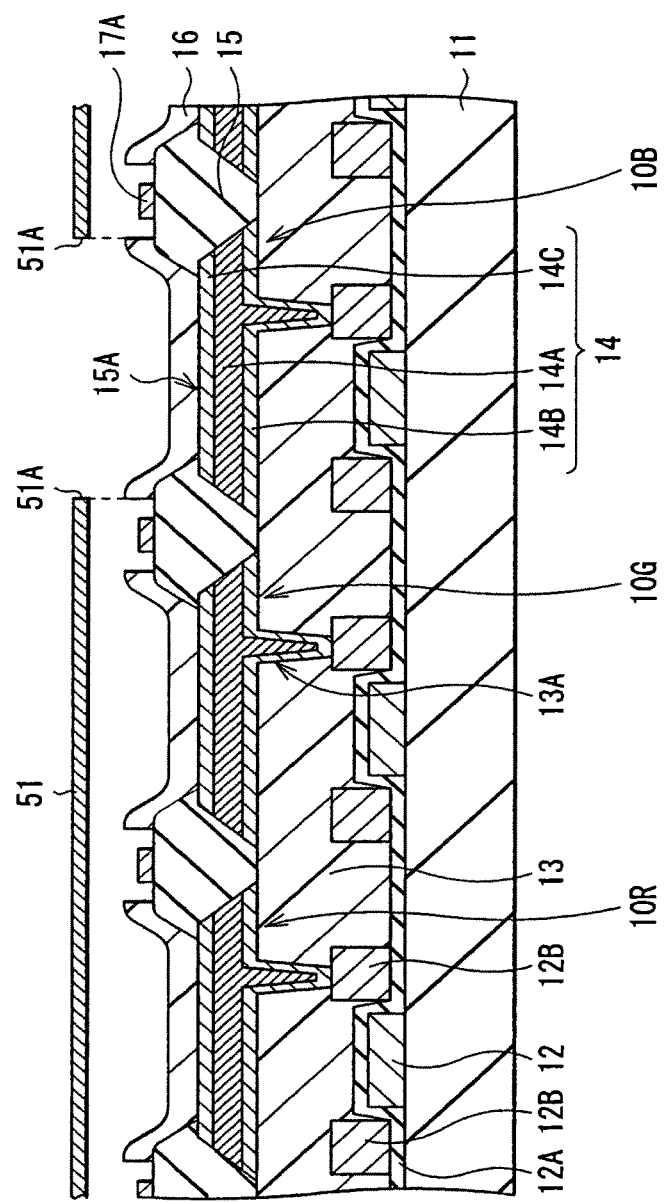
FIG. 14 is a cross sectional view showing a process according to an embodiment of the present invention.

After that, the deposition mask 51 is shifted. Then, as shown in FIG. 14, in a manner similar to in the organic layer 16 of the organic light-emitting device 10R, the hole transport layer 16A and the light-emitting layer 16B of the organic light-emitting device 10G, which have the foregoing film thickness and are made of the foregoing materials are sequentially deposited to form the organic layer 16 of the organic light-emitting device 10G. Subsequently, the deposition mask 51 is shifted again. Then, also as in FIG. 14, in a manner similar to in the organic layer 16 of the organic light-emitting device 10R, the hole transport layer 16A, the light-emitting layer 16B, and the electron transport layer 16C of the organic light-emitting device 10B, which have the foregoing film thickness and are made of the foregoing materials are sequentially deposited to form the organic layer 16 of the organic light-emitting device 10B. FIG. 14 shows a condition, wherein the opening 51A of the deposition mask 51 is facing to the organic layer 16 of the organic light-emitting device 10B.

Figure 15:
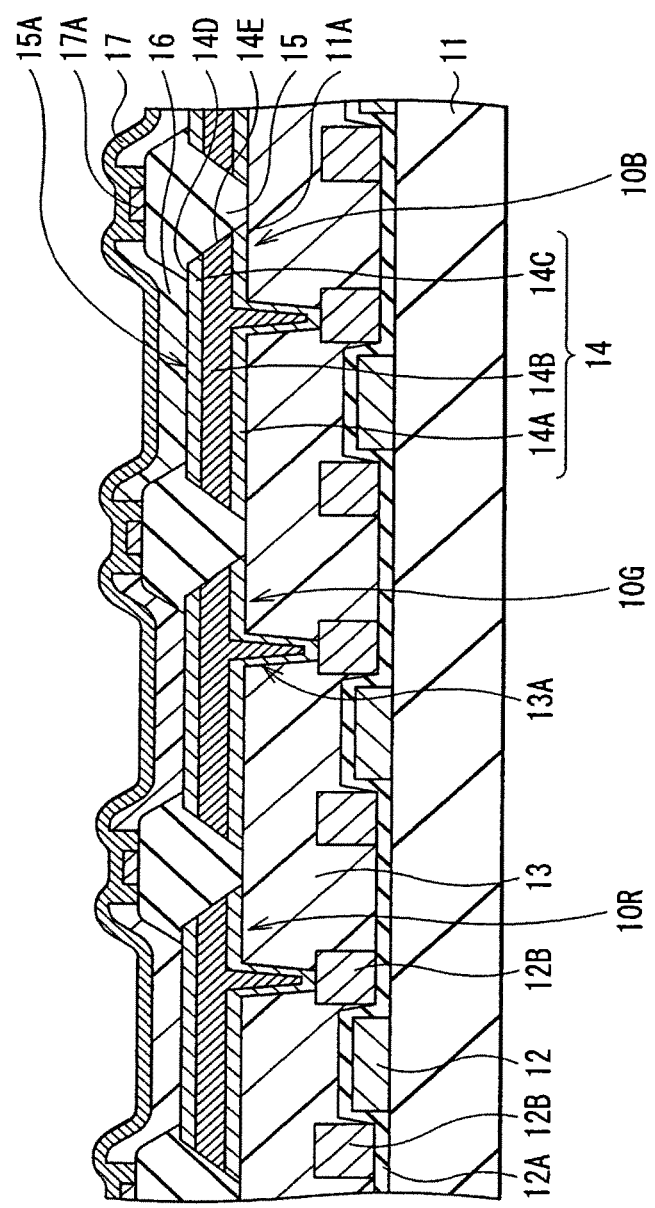
FIG. 15 is a cross sectional view showing a process according to an embodiment of the present invention.

After forming the organic layer 16 of the organic light-emitting devices 10R, 10G, and 10B, as shown in FIG. 15, the common electrode 17 which has the foregoing film thickness and is made of the foregoing material is formed over the whole area of the substrate 11 by, for example, deposition. The common electrode 17 is thereby electrically connected to the auxiliary electrode 17A and the unshown trunk-shaped auxiliary electrode which becomes a bus, which are already formed before. Consequently, the organic light-emitting devices 10R, 10G, and 10B shown in FIGS. 1, 5, and 6 are thereby formed.

Figure 16:
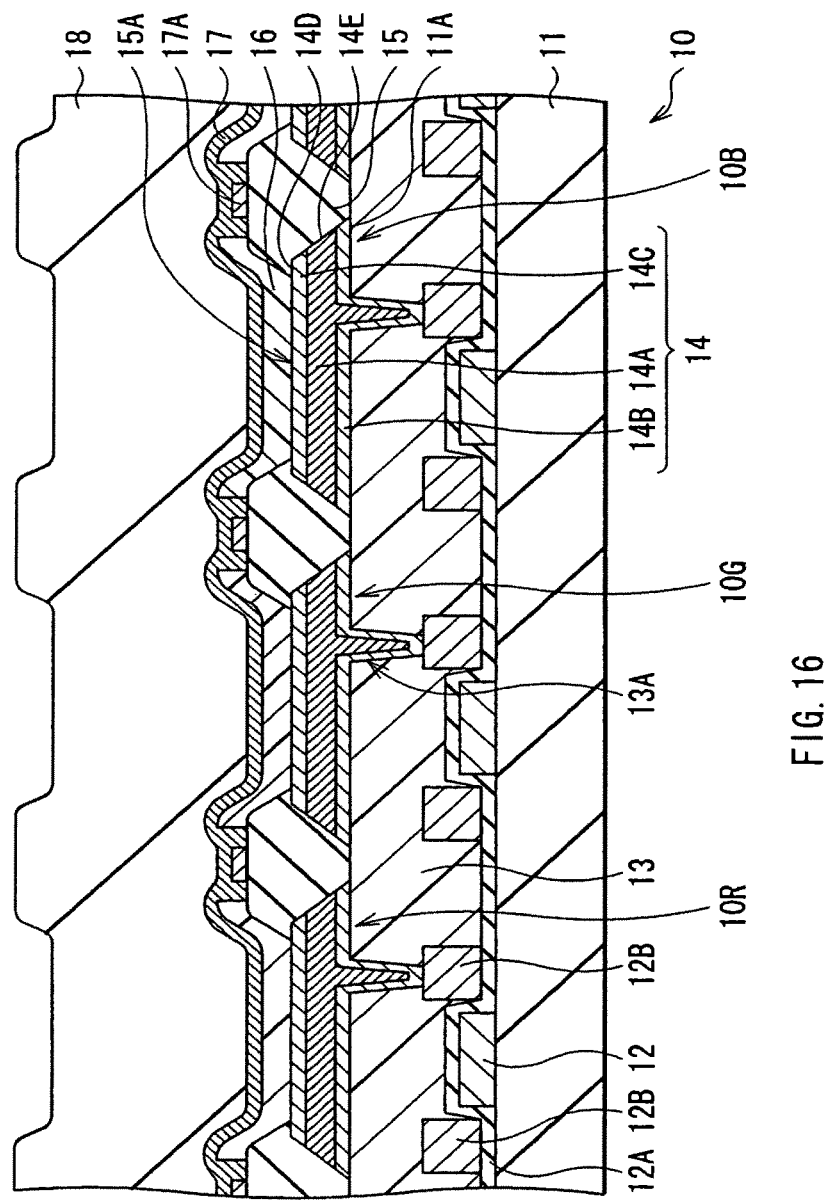
FIG. 16 is a cross sectional view showing a process according to an embodiment of the present invention.

Next, as shown in FIG. 16, the protective film 18 which has the foregoing film thickness and is made of the foregoing material is formed on the common electrode 17. Thereby, the driving panel 10 shown in FIG. 1 is formed.

Figure 17A:
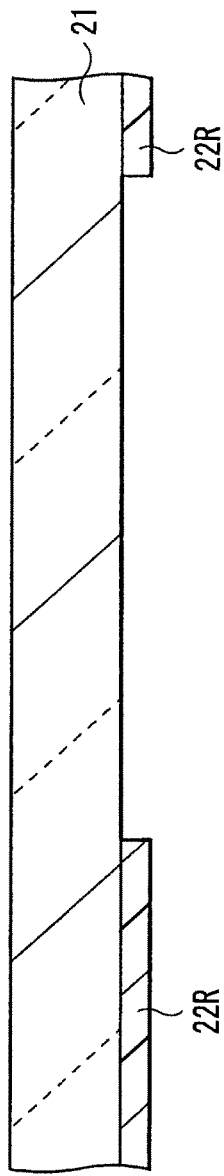
FIGS. 17A and 17B are cross sectional views showing processes according to an embodiment of the present invention.
Figure 17B:
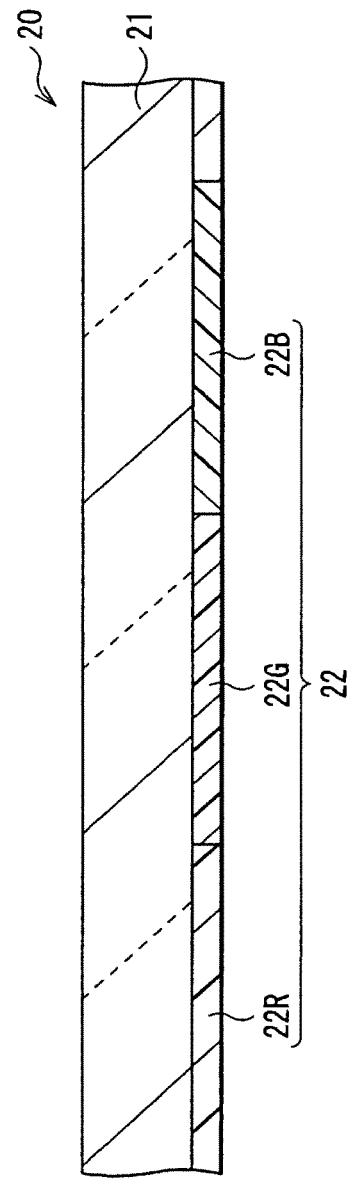

As shown in FIG. 17A, for example, the red filter 22R is formed by coating a material for the red filter 22R on the sealing substrate 21 made of the foregoing material by, for example, spin coat, patterning through photolithography, and firing the resultant. Subsequently, as shown in FIG. 17B, as in a manner similar to in the red filter 22R, the blue filter 22B and the green filter 22G are sequentially formed. The sealing panel 20 is thereby formed.

Figure 18:
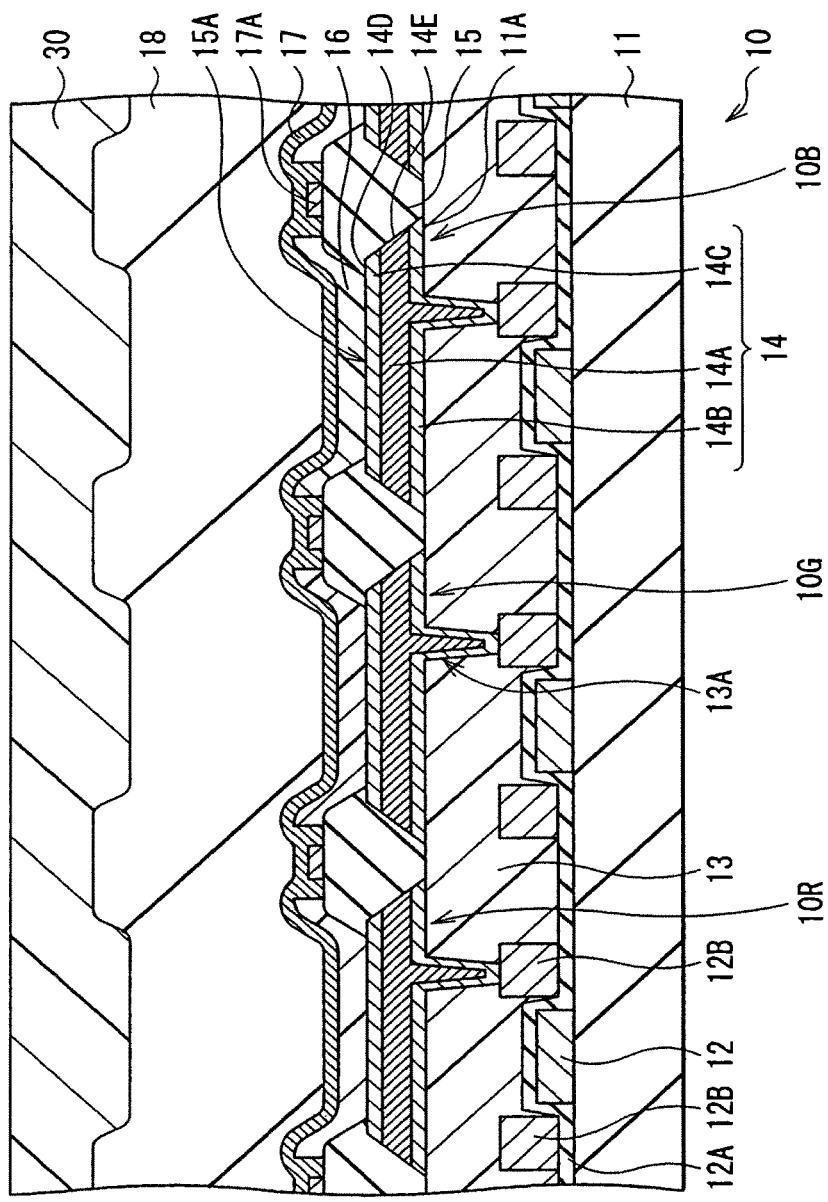
FIG. 18 is a cross sectional view showing a process following according to an embodiment of the present invention.

After forming the sealing panel 20 and the driving panel 10, as shown in FIG. 18, the adhesive layer 30 made of a thermosetting resin is formed by coating on a side of the substrate 11 wherein the organic light-emitting devices 10R, 10G, and 10B are formed. The coating can be performed by, for example, discharging a resin from a slit nozzle type dispenser, roll coating, or screen printing. Next, as shown in FIG. 1, the driving panel 10 and the sealing panel 20 are bonded together with the adhesive layer 30 in between. In this regard, it is preferable that a side of the sealing panel 20 where the color filter 22 is formed is arranged facing to the driving panel 10. It is preferable to avoid air bubbles and so on from entering into the adhesive layer 30. After that, relative positions of the color filter 22 of the sealing panel 20 and the organic light-emitting devices 10R, 10G, and 10B of the driving panel 10 are aligned. Then, the thermosetting resin of the adhesive layer 30 is cured by performing heat treatment at a given temperature for a given time. The display unit shown in FIGS. 1, 5, and 6 is thereby completed.

In this display unit, for example, when a given voltage is applied between the laminated structure 14 and the common electrode 17, current is injected into the light-emitting layer 16B of the organic layer 16, and holes and electrons are recombined. In result, light emitting arises mainly on the interface of the light-emitting layer 16B on the hole transport layer 16A side. This light multiple-reflects between the first end P1 and the second end P2, passes through the common electrode 17, and is extracted. Here, a cross section of the laminated structure 14 in the laminated direction is a forward tapered shape. Therefore, the sidewall face 14E is favorably covered with the insulating film 15. Consequently, deterioration of the reflective layer 14A due to deposition failure or holes of the insulating film 15 is prevented, and defect of the organic light-emitting devices 10R, 10G, and 10B is reduced.

As above, in this embodiment, a cross section of the laminated structure 14 in the laminated direction is a forward tapered shape. Therefore, deposition failure or holes of the insulating film 15 can be prevented, deterioration of the reflective layer 14A can be surely prevented, and defect of the organic light-emitting devices 10R, 10G, and 10B can be reduced. Consequently, this embodiment is particularly suitable for the case wherein the laminated structure 14 includes the reflective layer 14A made of silver (Ag) or an alloy containing silver. In this case, a reflectance of the laminated structure 14 can be improved, and light extraction efficiency can be improved.

In this embodiment, after all the adhesive layer 14B, the reflective layer 14A, and the barrier layer 14C are formed on the flat surface 11A of the substrate 11, they are etched all at once. Therefore, the sidewall face 14E can be easily formed in the forward tapered shape as mentioned above.

Figure 19:
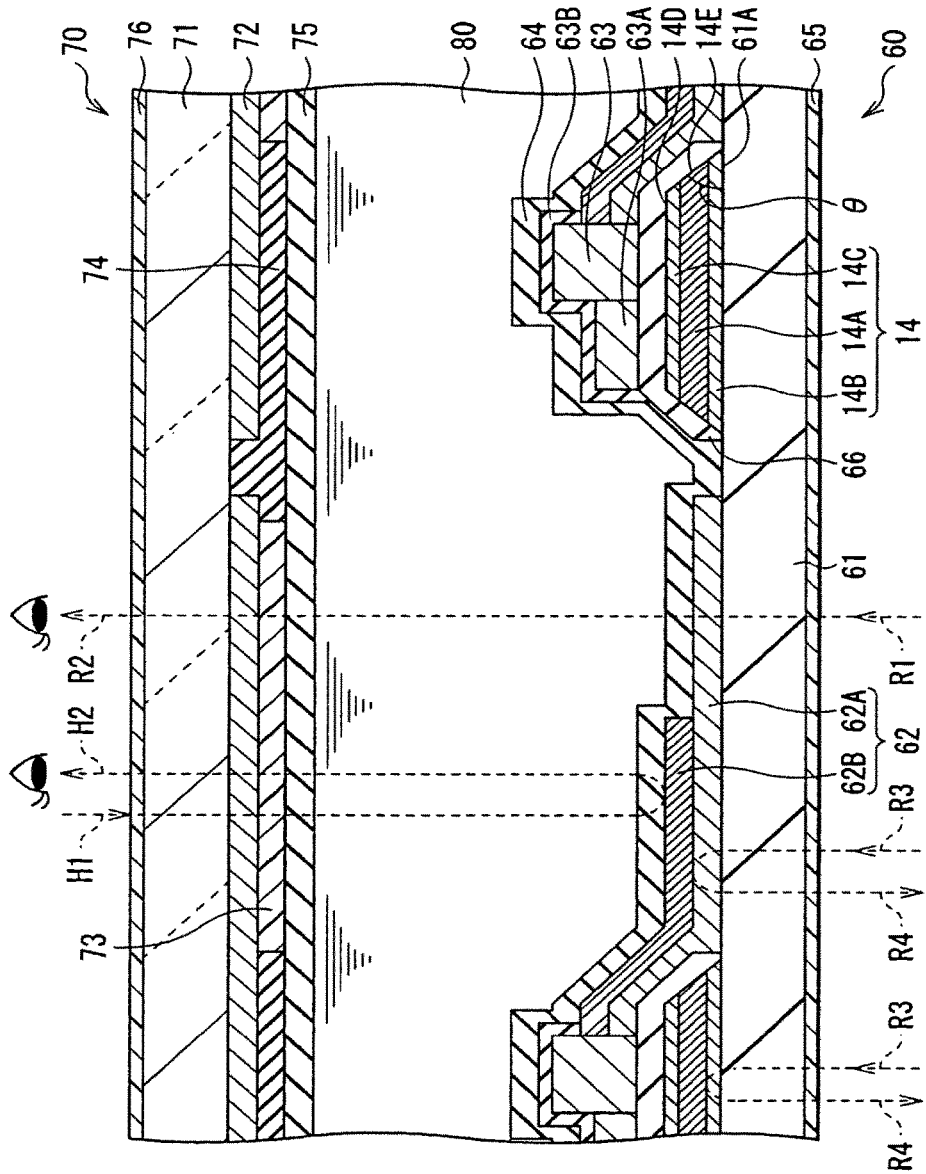
FIG. 19 is a cross sectional view showing a construction of a display unit according to a second embodiment of the present invention.

FIG. 19 shows a cross sectional structure of a display unit according to a second embodiment of the invention. This display unit is used as a transmissive/reflective (semi-transmissive) liquid crystal display. In this display unit, a driving panel 60 and an opposing panel 70 are arranged to face to each other, and a liquid crystal layer 80 is provided between them.

In the driving panel 60, a pixel electrode 62 is provided in the shape of a matrix on a substrate 61 made of, for example, glass. On the substrate 61, an active driving circuit including a TFT 63 as a driving device electrically connected to the pixel electrode 62, a wiring 63A and the like is formed. On the side of the substrate 61 facing to the liquid crystal layer 80, an alignment film 64 is provided over the whole area, and on the opposite side of the substrate 61, a polarizing plate 65 is provided. A laminated structure 14 similar to the laminated structure in the first embodiment is provided between the surface of the substrate 61, and the TFT 63 and the wiring 63A. For example, an insulating film 66 is provided between the laminated structure 14, and the TFT 63 and the wiring 63A.

The pixel electrode 62 includes a transparent electrode 62A and a reflective electrode 62B, for example. The transparent electrode 62A is made of, for example, ITO, and the reflective electrode 62B is made of, for example, aluminum (Al), silver (Ag) or the like. The reflective electrode 62B is formed to lie on part of the transparent electrode 62A. A region wherein the reflective electrode 62B lies on the transparent electrode 62A is a reflective display region, and a region wherein the reflective electrode 62B does not lie on the transparent electrode 62A is a transmissive display region.

A gate electrode (not shown) of the TFT 63 is connected to an unshown scanning circuit. A source (not shown) is connected to the wiring 63A as a signal line. A drain (not shown) is connected to the pixel electrode 62. A material for the wiring 63A is the same for the wiring 13B in the first embodiment. A construction of the TFT 63 is not particularly limited as in the TFT 12 in the first embodiment. The TFT 63 and the wiring 63A are covered with a protective film 63B made of, for example, silicon oxide ($SiO_2$) silicon nitride (SiN) or the like.

In this embodiment, the laminated structure 14 has a role as a reflective film to reflect incident light which did not enter the transparent electrode 62A and return such a light to an unshown backlight side. A material and a film thickness of the adhesive layer 14B, the reflective layer 14A, and the barrier layer 14C, a shape of the sidewall face 14E, a range of a taper angle θ made by the sidewall face 14E and a flat surface 61A of the substrate 61 and the like are similar to those of the first embodiment.

The alignment film 64 is made of, for example, an oblique deposition film such as silicon oxide ($SiO_2$). In this case, an after-mentioned pretilt angle of the liquid crystal layer 80 is controlled by changing a deposition angle in oblique deposition. As the alignment film 64, a film obtained by providing an organic compound such as polyimide with rubbing (alignment) treatment can be used. In this case, a pretilt angle can be controlled by changing rubbing conditions.

The polarizing plate 65 is an optical device which changes light from the unshown backlight into linear polarized light in a certain direction. For example, the polarizing plate 65 includes a polyvinyl alcohol (PVA) film and the like.

The insulating film 66 is made of, for example, silicon oxide ($SiO_2$) or the like. As the insulating film 66, a polyimide film can be used depending on processes.

The opposing panel 70 is positioned on the pixel electrode 62 side of the driving panel 60 and comprises an opposite substrate 71 made of glass or the like. On the opposite substrate 71, for example, a transparent electrode 72 and a color filter 73 are sequentially layered from the opposite substrate 71 side, facing to the pixel electrode 62. Further, on the opposite substrate 71, a light absorbing film 74 as a black matrix is provided along the interface with the color filter 73. On the side of the opposite substrate 71 facing to the liquid crystal layer 80, an alignment film 75 is provided over the whole area, and on the opposite side, a polarizing plate 76 is provided.

The transparent electrode 72 is made of, for example, ITO or the like. The color filter 73 is constructed as in the color filter 22 in the first embodiment. The light absorbing film 74 is intended to absorb outside light entering the opposite substrate 71 or reflected light of the outside light reflected by the wiring 64 to improve contrast. For example, the light absorbing film 74 is made of a black resin film wherein black coloring is mixed, which has an optical density of 1 or more, or a thin film filter utilizing interference of a thin film. The thin film filter is made by layering one or more thin films made of a metal, a metal nitride, or a metal oxide. The thin film filter attenuates light by utilizing interference of thin films. As the thin film filter, a filter wherein chromium and chromium oxide (III) ($Cr_2O_3$) are alternately layered can be cited specifically. The alignment film 75 and the polarizing plate 76 are constructed as in the alignment film 64 and the polarizing plate 65 of the driving panel 60.

The liquid crystal layer 80 changes a transmittance by changing alignment conditions due to voltage application. If dip directions of liquid crystal molecules are uneven in driving, the contrast becomes uneven. In order to avoid uneven contrast, a slight pretilt angle is previously given to the liquid crystal layer 80 in a certain direction.

This display unit can be manufactured as follows, for example.

First, the laminated structure 14 whose sidewall face 14E is in a forward tapered shape is formed on a flat surface 61A of the substrate 61 by firstly layering all the adhesive layer 14B, the reflective layer 14A, and the barrier layer 14C and then etching them all at once as in a manner similar to in the first embodiment. Next, the insulating film 66 made of the foregoing material is formed by, for example, CVD to cover the laminated structure 14. Further, the transparent electrode 62A and the reflective electrode 62B are formed to form the pixel electrode 62. Subsequently, the TFT 63 and the wiring 63A are formed on the laminated structure 14 and the insulating film 66, and then the protective film 63B is formed by, for example, CVD. After that, the alignment film 64 is formed over the whole area of the substrate 61, and rubbing treatment is provided. The driving panel 60 is thereby completed.

The transparent electrode 72, the light absorbing film 74, and the color filter 73 are formed on the surface of the opposite substrate 71. Next, the alignment film 75 is formed on the whole area of the opposite substrate 71, and rubbing treatment is provided. The opposing panel 70 is thereby formed.

Next, for example, a seal material (not shown) made of, for example, an epoxy resin is provided in the periphery part of the driving panel 60 or the opposing panel 70, and a spherical or columnar spacer (not shown) is provided. Subsequently, the driving panel 60 and the opposing panel 70 are aligned so that the pixel electrode 62 and the transparent electrode 72 face to each other, and are bonded together by curing the seal material. Then, the liquid crystal layer 80 is injected inside, and the resultant is sealed. After that, the polarizing plate 65 is attached to the driving panel 60, and the polarizing plate 76 is attached to the opposing panel 70. The display unit shown in FIG. 19 is thereby completed.

In this display unit, for example, when a given voltage is applied between the pixel electrode 62 and the transparent electrode 72, alignment conditions of the liquid crystal layer 80 are changed, and a transmittance is changed. Incident light R1 entering the transparent electrode 62A from the unshown backlight passes through the liquid crystal layer 80, and is extracted as a transmitted light R2. Incident light R3 entering the reflective electrode 62B or the laminated structure 14 from the backlight is reflected by the reflective electrode 62B or the reflective layer 14A of the laminated structure 14, and its reflected light R4 returns to the backlight side. The reflected light R4 enters the pixel electrode 62 again by an unshown reflecting mirror provided on the backlight. Further, an outside light H1 entering from the opposing panel 70 side is reflected by the reflective electrode 62B, and its reflected light H2 is extracted. Here, a cross section of the laminated structure 14 in the laminated direction is formed in a forward tapered shape. Therefore, the sidewall face 14E is favorably covered by the insulating film 66, the alignment film 64 or the like. Therefore, deterioration or the like of the reflective layer 14A due to deposition failure or holes of the insulating film 66, the alignment film 64 or the like can be prevented.

As above, in this embodiment, as in the first embodiment, the cross section of the laminated structure 14 in the laminated direction is formed in a forward tapered shape. Therefore, deposition failure or holes of the insulating film 66, the alignment film 64 or the like can be prevented, and deterioration or corrosion of the reflective layer 14A can be surely prevented. Therefore, this embodiment is particularly suitable for the case where the laminated structure 14 includes the reflective layer 14A made of silver (Ag) or an alloy containing silver. In this case, it is possible to raise a reflectance of the laminated structure 14 to improve utilization efficiency of the backlight, and to reduce power consumption of the display unit.

While the invention has been described with reference to the embodiments, the invention is not limited to the foregoing embodiments, and various modifications may be made. For example, the materials, thicknesses, depositions, deposition conditions and the like are not limited to those described in the foregoing embodiments. Other materials, thicknesses, depositions, and deposition conditions can be applied.

For example, in the foregoing embodiments, descriptions have been given of the case wherein the adhesive layer 14B and the barrier layer 14C are made of a metal compound or a conductive oxide containing at least one element, such as indium (In), tin (Sn), zinc (Zn) and the like, particularly of the case wherein the adhesive layer 14B and the barrier layer 14C are made of at least one type of material, such as ITO, IZO, indium oxide ($In_2O_3$), tin oxide ($SnO_2$), zinc oxide (ZnO) and the like. However, one of the adhesive layer 14B and the barrier layer 14C can be made of a material other than the foregoing materials. For example, for the barrier layer 14C, its material is not limited to the foregoing materials as long as a material is transparent, has a small light absorbance, and is capable of being etched with the reflective layer 14A and the adhesive layer 14B all at once.

Further, for example, for the adhesive layer 14B, deposition, CVD, MOCVD (Metal Organic Chemical Vapor Deposition), laser ablation, and plating can be used in addition to sputtering. Similarly, for the reflective layer 14A, deposition, CVD, MOCVD, laser ablation, and plating can be used in addition to sputtering.

In addition, in the foregoing first embodiment, descriptions have been given of the construction of the organic light-emitting devices 10R, 10G, and 10B with a concrete example. However, it is no need to provide all the layers such as the insulating film 15, the auxiliary electrode 17A, the protective film 18 and the like, and other layer can be further added. This invention can be applied also to the case wherein the common electrode 17 is not a semi-transparent electrode but a transparent electrode, and has no resonator structure. However, this invention is intended to raise a reflectance in the laminated structure 14. Therefore, when the resonator structure is constructed by setting the organic layer 16 and the barrier layer 14C to a resonant part, where the interface between the reflective layer 14A and the barrier layer 14C of the laminated structure 14 is the first end P1, and the interface of the common electrode 17 on the light-emitting layer 16B side is the second end P2, higher effects can be obtained.

Figure 20:
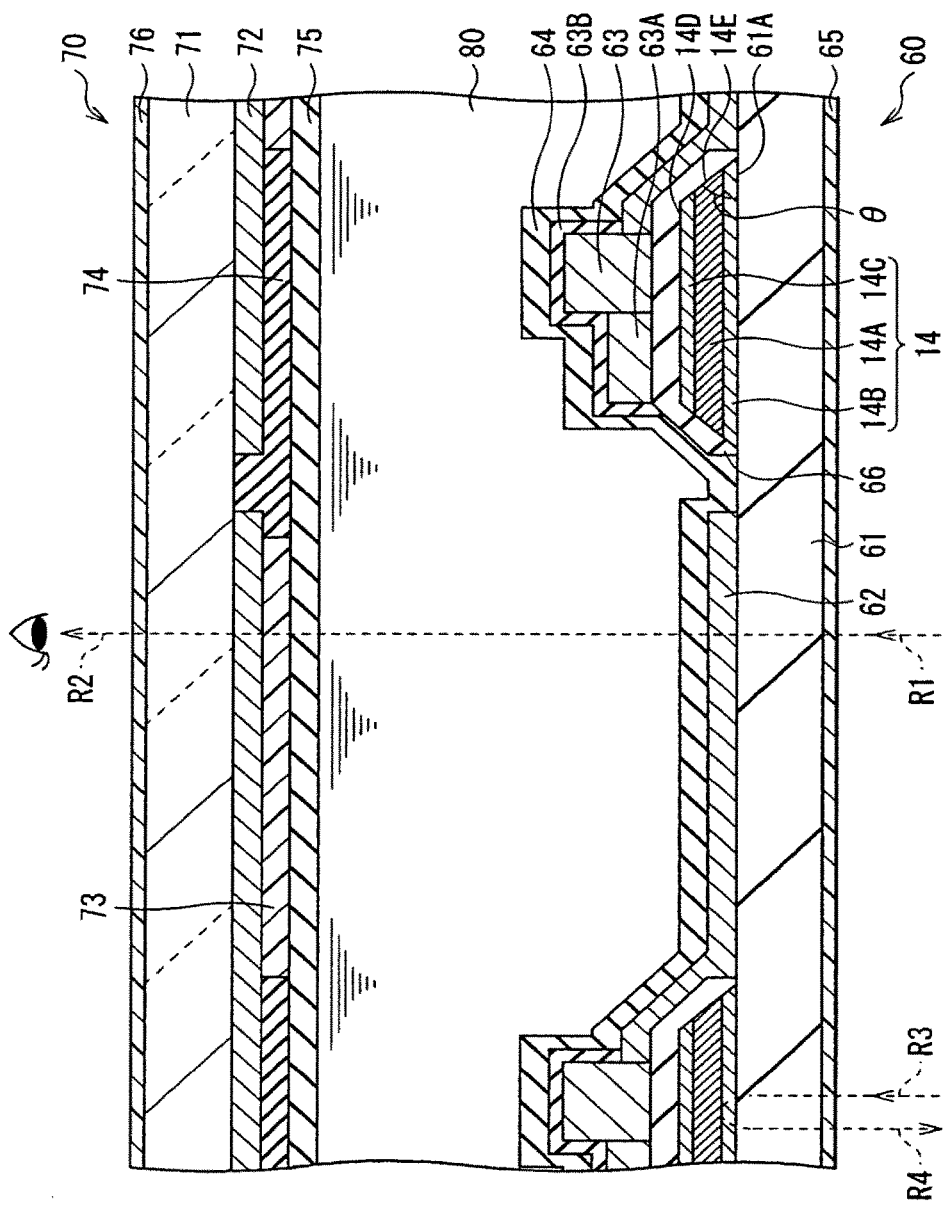
FIG. 20 is a cross sectional view showing a construction of a display unit according to an embodiment of the present invention.
Figure 21:
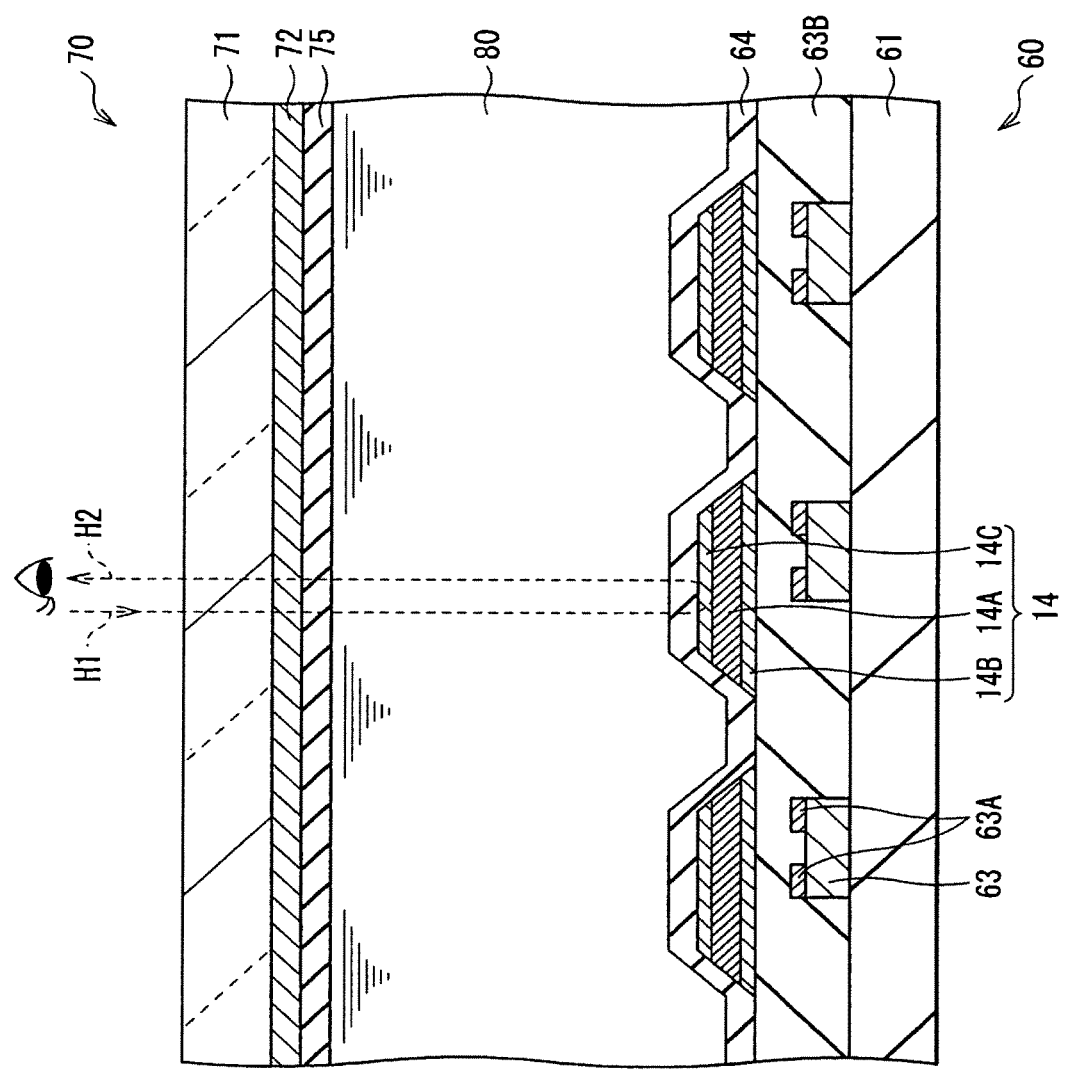
FIG. 21 is a cross sectional view showing a construction of a display unit according to an embodiment of the present invention.

Further, in the second embodiment, descriptions have been given of the transmissive/reflective liquid crystal display as an example. However, this invention can be applied to other types of the liquid crystal displays. For example, as shown in FIG. 20, it is possible to provide the laminated structure 14 as a reflective film in a transmissive liquid crystal display. As shown in FIG. 21, it is also possible that the laminated structure 14 is used as a reflective pixel electrode. It is also possible that the laminated structure 14 is provided instead of the reflective electrode 62B or the wiring 63A in the second embodiment.

In addition, in the foregoing second embodiment, descriptions have been given of the construction of the liquid crystal display device with a concrete example. However, it is no need to provide all the layers or members. Further, additional other layers or other members can be added.

Further, in the foregoing embodiments, descriptions have been given of the case wherein the invention is applied to the display units such as the organic light-emitting display unit and the liquid crystal display unit. However, application of the laminated structure of the invention is not limited to application as a reflective electrode or a reflective film. For example, the laminated structure of the invention can be used as a metal wiring by taking advantage of low resistance in the reflective layer 14A. In this case, the metal wiring capable of preventing silver corrosion, and having a superior performance can be realized.

In addition, application of the display device, particularly the organic light-emitting device of the invention is not always limited to the display unit. For example, a simple lighting not intended for display can be made according to an embodiment.

As described above, according to the laminated structure, the display device, and the display unit of the invention, the cross section of the laminated structure in the laminated direction is formed in a forward tapered shape. Therefore, coverage in the sidewall face is improved, and deposition failure or holes of the insulating film or the like covering the sidewall face can be prevented.

According to the method for manufacturing the laminated structure of the invention, the sidewall face is formed in a forward tapered shape by firstly forming all the plurality of layers on the surface of the substrate, and then etching them all at once. Therefore, the laminated structure in the forward tapered shape can be easily formed.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A manufacturing method of an organic light emitting device, comprising:
   providing a substrate;
   forming an anode including, stacked in this order:
   a first anode layer comprising a metal compound or a conductive oxide,
   a second anode layer that is a reflective layer, and a third anode layer comprising a metal compound or a conductive oxide;
forming an insulating film so as to cover the anode;
patterning the insulating film so as to partially expose the anode;
forming an organic layer over the exposed portion of the anode and the insulating film, the organic layer comprising a light-emitting layer; and
forming a cathode on the organic layer,
wherein the organic light emitting device is configured to generate light in the light-emitting layer, and the light is extracted through the cathode,
wherein a thickness of the third anode layer is between about 3-15 nm, and
wherein the patterning the laminated structure includes making a side surface of the second anode layer a convex shape when viewed as a cross-section in the laminated direction of the anode.

2. The manufacturing method according to claim 1, wherein forming the anode includes:
forming a first anode layer on the substrate;
forming a second anode layer on the first anode layer, the second anode layer being a reflective layer;
forming a third anode layer on the first anode layer; and
after forming the third anode layer, patterning a laminated structure including the first, the second and the third anode layers.

3. The manufacturing method according to claim 1, wherein a thickness of the first anode layer is between about 5-50 nm and a thickness of the second anode layer is between about 50-150 nm.

4. The manufacturing method according to claim 1, further comprising forming a protective film on the cathode.

5. The manufacturing method according to claim 4, wherein the protective film has a thickness ranging from about 500 nm to about 10,000 nm.

6. The manufacturing method according to claim 4, wherein the protective film comprises at least one selected from the group consisting of $SiO_2$ and SiN.

7. The manufacturing method according to claim 4, further comprising forming a sealing panel that includes a sealing substrate formed on a side of the organic light emitting device opposite to the substrate-side,
wherein the protective film is between the sealing substrate and the cathode of the organic light emitting device.

8. The manufacturing method according to claim 7, further comprising forming an adhesive layer between the sealing substrate and the protective film.

9. The manufacturing method according to claim 8, wherein the adhesive layer includes a resin.

10. The manufacturing method according to claim 9, wherein the resin is a thermosetting resin.

11. The manufacturing method according to claim 1, wherein the second anode layer comprises Ag.

12. The manufacturing method according to claim 1, wherein the first anode layer comprises a material selected from the group consisting of indium tin oxide, indium zinc oxide, indium oxide, tin oxide and zinc oxide, and
wherein the third anode layer comprises a material selected from the group consisting of indium tin oxide, indium zinc oxide, indium oxide, tin oxide and zinc oxide.

* * * * *